(12) United States Patent
Sakamoto

(10) Patent No.: US 8,212,303 B2
(45) Date of Patent: Jul. 3, 2012

(54) NONVOLATILE SEMICONDUCTOR MEMORY DEVICE

(75) Inventor: Wataru Sakamoto, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 118 days.

(21) Appl. No.: 12/821,689

(22) Filed: Jun. 23, 2010

(65) Prior Publication Data
US 2011/0193151 A1 Aug. 11, 2011

(30) Foreign Application Priority Data
Feb. 10, 2010 (JP) ................................. 2010-028107

(51) Int. Cl.
*H01L 29/94* (2006.01)
(52) U.S. Cl. .................... 257/314; 257/316; 257/E29.3; 257/E29.129; 438/257
(58) Field of Classification Search .......... 257/314–316, 257/E29.3, E29.129; 438/257, 201, 266
See application file for complete search history.

(56) References Cited

U.S. PATENT DOCUMENTS

| 7,786,524 B2 * | 8/2010 | Hazama ........................ 257/316 |
| 7,948,021 B2 * | 5/2011 | Maekawa ...................... 257/316 |
| 8,076,205 B2 * | 12/2011 | Maekawa ...................... 438/286 |
| 2006/0278919 A1 | 12/2006 | Takahashi |
| 2007/0161187 A1 | 7/2007 | Hwang et al. |

FOREIGN PATENT DOCUMENTS
| JP | 2009-54956 | 3/2009 |
| JP | 2009-99909 | 5/2009 |

OTHER PUBLICATIONS

Chang-Hyun Lee, et al., "Multi-Level NAND Flash Memory with 63 nm-node TANOS (Si-Oxide-SiN-Al$_2$O$_3$-TaN) Cell Structure", IEEE Symposium on VLSI Technology Digest of Technical Papers, 2006, 2 pages.

* cited by examiner

*Primary Examiner* — Jack Chen
(74) *Attorney, Agent, or Firm* — Oblon, Spivak, McClelland, Maier & Neustadt, L.L.P.

(57) ABSTRACT

According to one embodiment, a nonvolatile semiconductor memory device includes a semiconductor substrate including a first region in which a memory cell transistor is arranged, a second region in which an electrode that extracts a word line electrically connected to the memory cell transistor is arranged, and a third region in which a peripheral transistor is arranged, the semiconductor substrate including an element isolation layer which separates adjacent active regions, first active regions provided in the first region and each having a first width, second active regions provided in the second region and each having a second width greater than the first width, third active regions provided in the third region and each having a third with greater than the first width. An upper surface of an element isolation layer in the second region is higher than that of an element isolation layer in the first region.

11 Claims, 23 Drawing Sheets

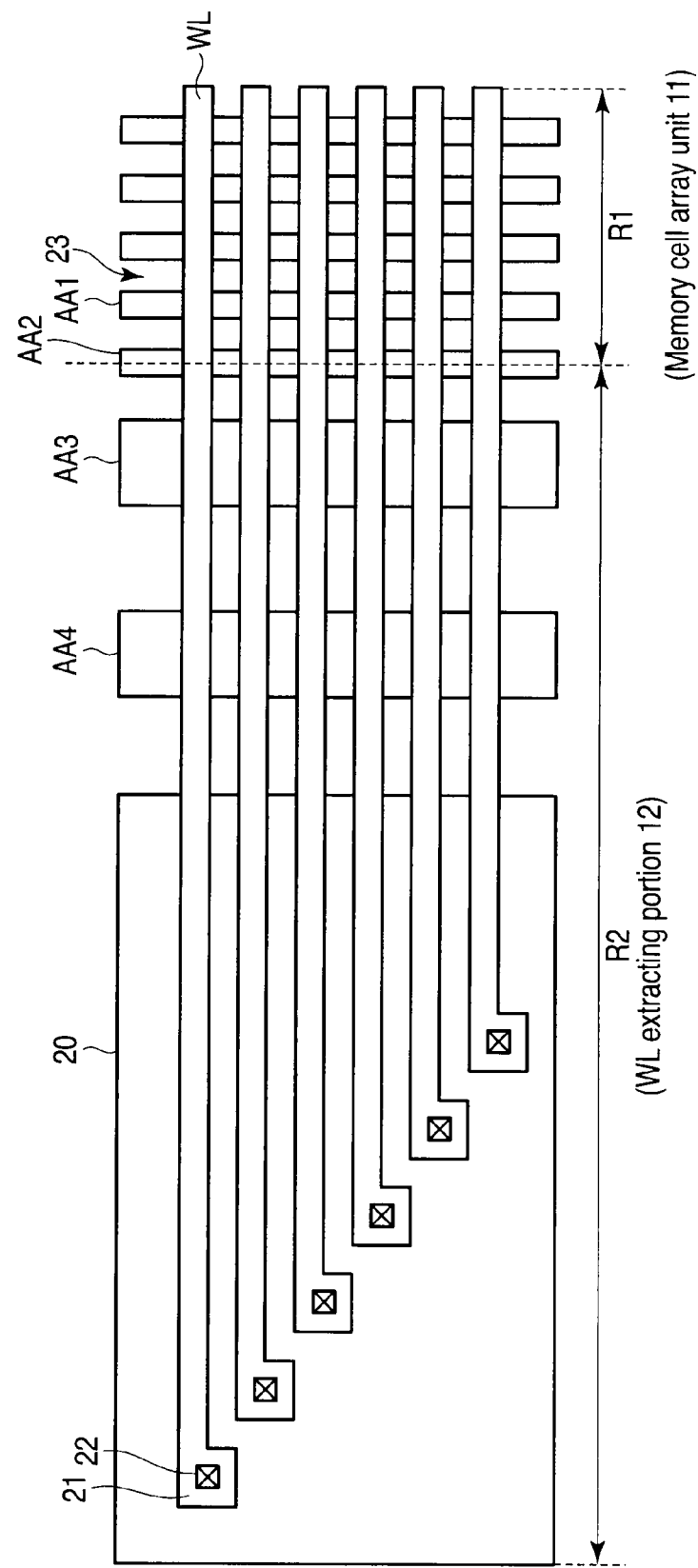
F I G. 3

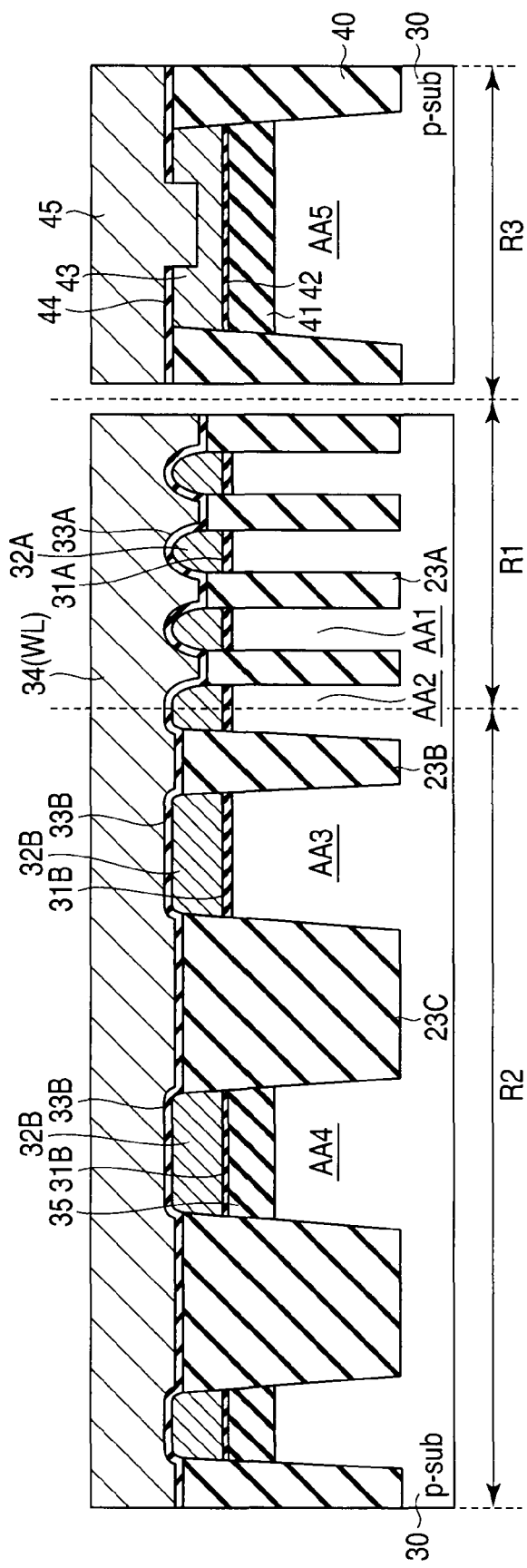
F I G. 4

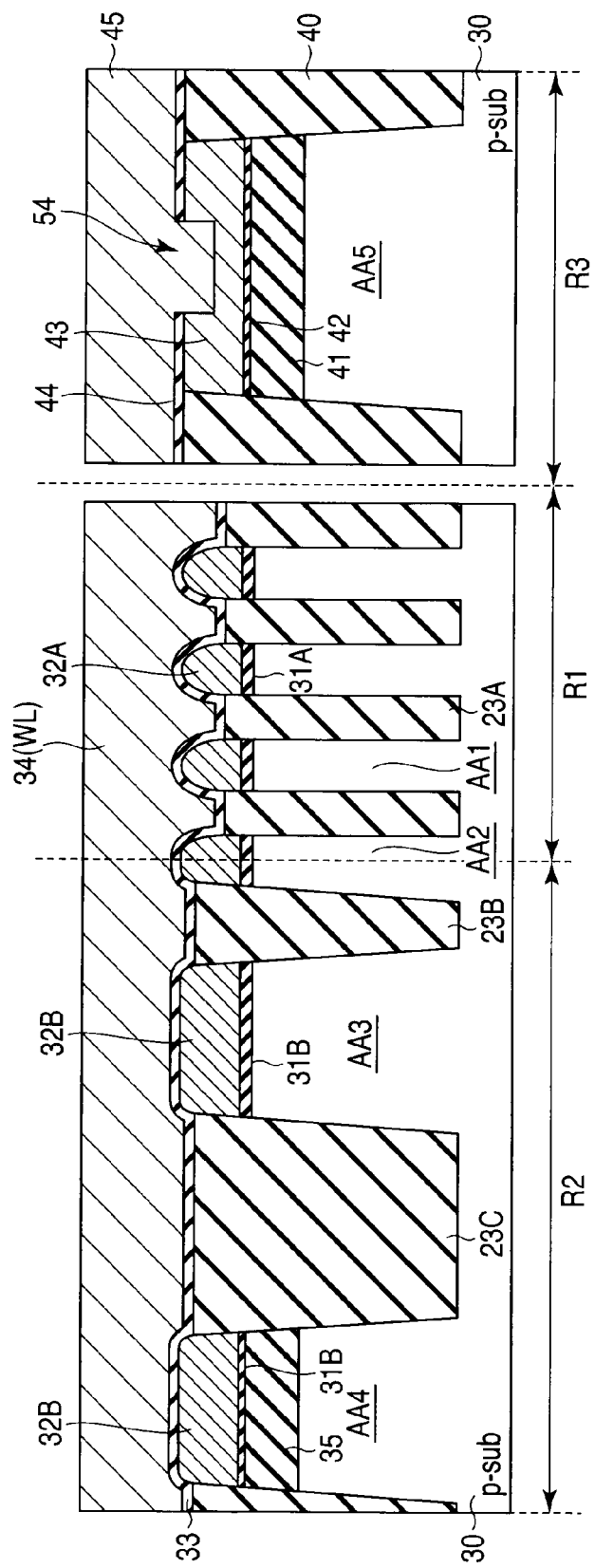
F I G. 19

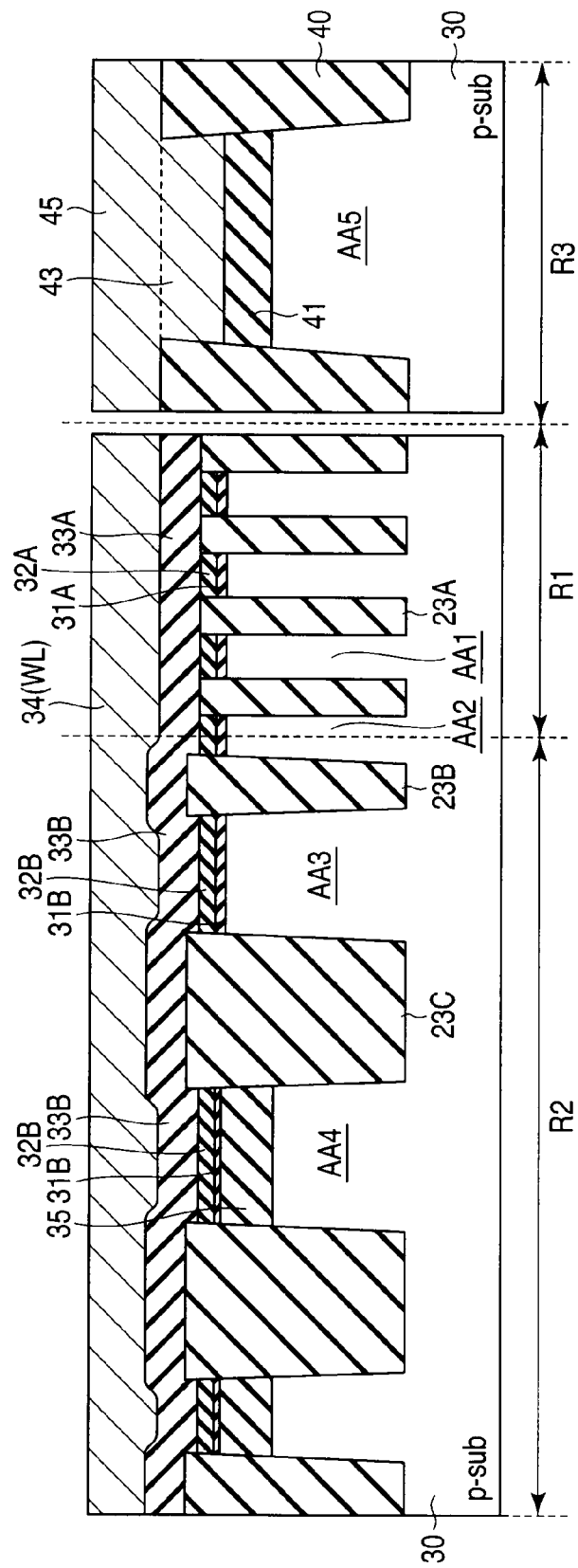
F I G. 24

NONVOLATILE SEMICONDUCTOR MEMORY DEVICE

CROSS-REFERENCE TO RELATED APPLICATIONS

This application is based upon and claims the benefit of priority from Japanese Patent Application No. 2010-028107, filed Feb. 10, 2010; the entire contents of which are incorporated herein by reference.

FIELD

Embodiments described herein relate generally to a nonvolatile semiconductor memory device.

BACKGROUND

Nonvolatile semiconductor memory devices, such as a flash memory, capable of electrically writing and erasing are broadly adopted as high-capacity memory media, such as digital cameras, mobile terminals, portable audio apparatuses, and personal computers. Two types of nonvolatile memory cell transistors are known as being used as flash memories: a stacked gate structure type, which includes a floating gate electrode and a control gate electrode; and a charge trap flash structure type (as disclosed in "Multi-Level NAND Flash Memory with 63 nm-node TANOS (Si-Oxide-SiN—$Al_2O_3$—TaN) Cell Structure", IEEE VLSI Tech. Dig. 2006). The charge trap structure is also referred to as a MONOS structure, which is an abbreviation of Metal-Oxide-Nitride-Oxide-Semiconductor.

An active region of an array end in the proximity of a word line (WL) extracting portion is becoming more and more complex in shape, as miniaturization advances. This is because a thin line-and-space pattern should be made such that a lithography margin is secured at an array end where periodicity ends when the pattern is exposed through lithography, since the width of an active region in a cell array portion is becoming more and more miniaturized.

In a MONOS structure, a block insulating film after an element isolation layer such as a shallow trench isolation (STI) is formed, so as to increase an electric field that is applied to a tunnel insulating film during writing and erasing operations and obtain appropriate writing and erasing properties. Thereby, the structure is configured such that a distance between a control gate electrode and a semiconductor substrate is short. In this cell transistor structure, if the STI of the cell array portion become an appropriate depth, the depth of the STI becomes deep at the array end, where the line-and-space pattern is larger than that of the cell array portion. Further, since the control gate electrode and the semiconductor substrate become close to each other, the breakdown voltage deteriorates. That is, the array end may become a portion capable of determining the voltage to be applied to the control gate electrode.

In the stacked gate structure, since an STI adjacent to a floating gate electrode is lowered such that a coupling ratio is maintained as the width of the active region is more shrunk, the distance between a control gate electrode connected to a word line and a semiconductor substrate becomes shorter. Accordingly, if the STI is lowered to a depth appropriate for maintaining the coupling ratio, the depth of the STI becomes deep in the array end where the line-and-space pattern is large, and the semiconductor substrate becomes closer to the control gate electrode than the cell array portion, which results in deterioration in breakdown voltage. Thus, as in the case of the MONOS structure, there is a concern that the array end may become a portion that determines the voltage that can be applied to the control gate electrode.

BRIEF DESCRIPTION OF THE DRAWINGS

FIG. 3 is a plan view illustrating a configuration of a WL extracting portion 12;

FIG. 4 is a cross-sectional view of the memory cell array unit 11 and the WL extracting portion 12 cut along the word line;

FIG. 19 is a cross-sectional view illustrating a manufacturing step of the nonvolatile semiconductor memory device 10 following FIG. 18;

FIG. 24 is a cross-sectional view of a memory cell array unit 11 and a WL extracting portion 12 cut along a word line, according to the second embodiment.

DETAILED DESCRIPTION

Figure 1:
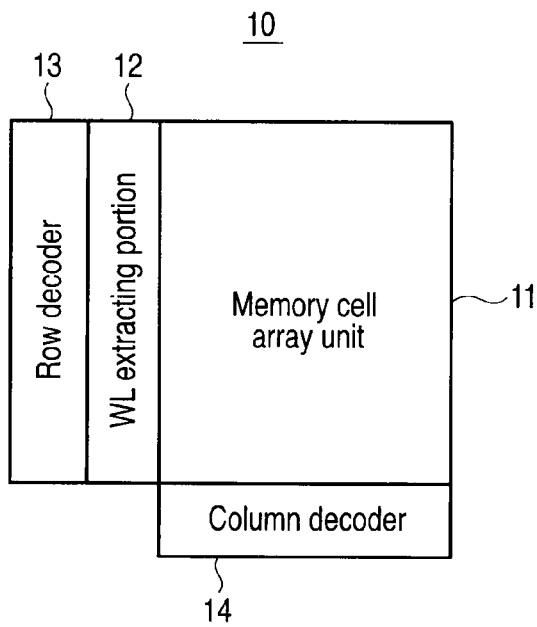
FIG. 1 is a block diagram illustrating a configuration of a nonvolatile semiconductor memory device 10 according to a first embodiment.

In general, according to one embodiment, there is provided a nonvolatile semiconductor memory device comprising:
a semiconductor substrate including a first region in which a memory cell transistor is arranged, a second region in which an electrode that extracts a word line electrically connected to the memory cell transistor is arranged, and a third region in which a peripheral transistor is arranged, the semiconductor substrate including an element isolation layer which separates adjacent active regions;
first active regions provided in the first region and each having a first width;
a first stacked film including a tunnel insulating film and a floating gate electrode stacked on each of the first active regions;
second active regions provided in the second region and each having a second width greater than the first width;
a second stacked film including the tunnel insulating film and the floating gate electrode stacked on each of the second active regions;
third active regions provided in the third region and each having a third with greater than the first width;
a third stacked film including the tunnel insulating film and the floating gate electrode stacked on each of the third active regions;
an intergate insulating film provided on the floating gate electrode and the element isolation layer;
a control gate electrode provided on an intergate insulating film in the first and second regions and corresponding to the word line; and
a gate electrode provided on an intergate insulating film in the third region,
wherein an upper surface of an element isolation layer in the second region is higher than an upper surface of an element isolation layer in the first region, and
a curvature radius of a corner of an upper portion of the floating gate electrode of the second stacked film is greater than that of the floating gate electrode of the third stacked film.

Hereinafter, an embodiment will be described with reference to the accompanying drawings. Please be noted that the drawings are either schematic or conceptual, and the dimensions and the ratios in the drawings are not necessarily equal to those of the actual ones. Further, when the same structural element is denoted in different drawings, the dimensions and the ratios shown in the drawings may be represented differently. In particular, the embodiments that will be described below merely show a device and a method for embodying the technical idea of the embodiment by way of example. The technical idea of the embodiment is not specified by the shapes, structures, or the arrangements of the structural elements disclosed in these embodiments. In the descriptions that follow, the elements having the same function and structure will be denoted by the same reference numeral and overlapping descriptions of such elements will be made only when necessary.

First Embodiment

FIG. 1 is a block diagram illustrating a configuration of a nonvolatile semiconductor memory device 10 according to the first embodiment. The nonvolatile semiconductor memory device 10 is a NAND flash memory, which is capable of electrically rewriting data.

The semiconductor memory device 10 comprises a memory cell array unit 11 including a plurality of memory cells. In the memory cell array unit 11, a plurality of word lines WL each extending in the row direction, a plurality of selection gate lines SG each extending in the row direction, and a plurality of bit lines BL each extending in the column direction.

A WL extracting portion 12, configured to extract the word lines WL and the selection gate lines SG from the memory cell array unit 11 and connect the word lines WL and the selection gate lines SG to peripheral circuits, is provided at an end of the memory cell array unit 11.

A row decoder 13 is electrically connected to the word lines WL and the selection gate lines SG via the WL extracting portion 12, and various kinds of voltages are applied to the word lines WL and the selection gate lines SG during writing, reading, and erasing operations. A column decoder 14 is electrically connected to the bit lines BL. The peripheral circuits actually include a sense amplifier that reads data in the memory cells and a driver that controls potentials of wirings and a substrate, for example, although not shown.

Figure 2:
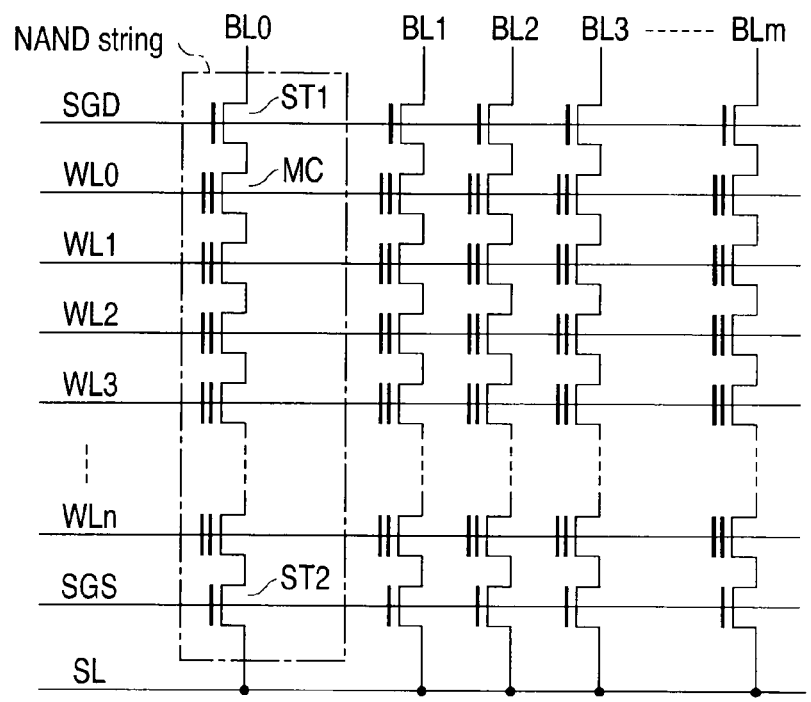
FIG. 2 is an equivalent circuit diagram illustrating a configuration of a block included in a memory cell array unit 11.

The memory cell array unit 11 comprises a plurality of blocks, by each of which data is erased. FIG. 2 is an equivalent circuit diagram illustrating a configuration of a block included in the memory cell array unit 11.

The block comprises (m+1) number of NAND strings sequentially arranged in a row direction, where m is an integer equal to or more than 1. Each NAND string comprises two selection transistors ST1, ST2, and (n+1) number of memory cells (which may also be memory cell transistors) MC, where n is an integer equal to or more than 1. The selection transistors ST1 included in the (m+1) number of NAND strings include drains connected to the bit lines BL0-BLm and gates commonly connected to the selection gate line SGD. The selection transistors ST2 included in the (m+1) number of NAND strings include sources commonly connected to the source line SL and gates commonly connected to the selection gate line SGS.

The memory cell transistor MC is a metal oxide semiconductor field effect transistor (MOSFET) having a stacked gate structure formed on a semiconductor substrate via a tunnel insulating film. A detailed configuration of the memory cell transistor MC will be described in detail below.

The (n+1) number of memory cell transistors MC in each of the NAND strings are arranged such that the current paths are connected in series between the source of the selection transistor ST1 and the drain of the selection transistor ST2. That is, the memory cell transistors MC are connected in series in the column direction such that adjacent memory cell transistors MC share a diffusion region (a source region or a drain region).

Control gate electrodes are connected to the word lines WL0-WLn in the order from the memory cell transistor MC positioned nearest to the drain side, for example. Accordingly, the drain of the memory cell transistor MC connected to the word line WL0 is connected to the source of the selection transistor ST1, and the source of the memory cell transistor MC connected to the word line WLn is connected to the drain of the selection transistor ST2.

The word lines WL0-WLn commonly connect the control gate electrodes of the memory cell transistors in NAND strings in a block. That is, the control gate electrodes of the memory cell transistors MC in the same row in a block are connected to the same word line WL. The (m+1) number of memory cell transistors MC connected to the same word line WL will be handled as a page, by which unit data is written and read.

The bit lines BL0-BLm commonly connect the drains of the selection transistors ST1 in different blocks. That is, the NAND strings in the same column in different blocks are connected to the same bit line BL.

FIG. 3 is a plan view illustrating a configuration of the WL extracting portion 12. A region R2 is a region where the WL extracting portion 12 is arranged, and a region R1 is a region where the memory cell array unit 11 is arranged.

The word lines WL provided in the memory cell array unit 11 extend up to the region R2. An insulating layer 20 is provided in the region R2 by way of example. A plurality of electrodes 21 are provided on the insulating layer 20, such that the number of the electrodes 21 corresponds to the number of the word lines WL. Each of the electrodes 21 is connected to a corresponding word line WL. A contact 22 is provided on the electrode 21, and the electrode 21 is electrically connected to the row decoder 13 via the contact 22. The same applies to the selection gate lines SG.

A plurality of active regions AA1, configured as a line-and-space pattern with minimum processing size (F: minimum feature size) caused by a manufacturing process (an exposure device, for example), are provided on a semiconductor substrate of the region R1. An element isolation layer 23, formed of an insulator, is provided between the active regions, and adjacent active regions are electrically insulated from one another by the element isolation layer 23. The element isolation layer 23 is formed in a shallow trench isolation (STI) formed by forming a trench in a semiconductor substrate and embedding an insulator in the trench, for example.

Each of the active region and the element isolation layer, formed with the line-and-space pattern of the minimum feature size F, has a width of the minimum feature size F (half pitch). It is to be noted that the active regions and the element isolation layers of the memory cell array unit 11 may be processed using double patterning through a sidewall transfer technique. In this case, each of the active region and the element isolation layer has a width approximately half the minimum feature size caused by the exposure device.

Active regions AA3 and AA4, formed as a line-and-space pattern greater than the minimum feature size F, are provided in the region R2, so as to secure a lithography margin during an exposure step. There is no restriction on the number of the active regions to be formed in the region R2; the number may be 1, or 3 or more. An active region AA2, formed with the minimum feature size F, is provided in the boundary between the region R1 and the region R2, i.e., between the active region AA1 and the active region AA3. The active region AA2 is not used as a memory cell, since its shape has low reliability. FIG. 3 shows only one dummy active region AA2, which becomes a lowered STI boundary, but the number of the dummy active regions AA2 is not limited to one and may be two or more when a matching error by lithography is large.

The active regions AA3 and AA4 having a width greater than the minimum feature size F to form the active region AA1 for a memory cell in a desired shape. By forming the active regions AA3 and AA4 with a greater width adjacent to the line-and-space pattern (including the active regions AA1 and AA2) of the minimum feature size F, it is possible to prevent the active region AA1 from inclining or falling. Accordingly, the active regions AA3 and AA4 having greater widths need to be provided at an end of the memory cell array unit 11.

FIG. 4 is a cross-sectional view of the memory cell array unit 11 and the WL extracting portion 12, cut along the word line. The region R1 is a region where the memory cell array unit 11 is arranged, and the region R2 is a region where the WL extracting portion 12 is arranged. FIG. 4 also shows an N-channel MOSFET, for example, arranged in a peripheral circuit such as the row decoder 13. The MOSFET arranged in a peripheral circuit is a high-voltage MOSFET capable of using a high voltage of equal to or more than 20V. R3 is a region where the peripheral circuit is arranged. The memory cell array unit 11, the WL extracting portion 12, and the peripheral circuit (the row decoder 13, for example) are disposed on the same substrate.

A p-type semiconductor substrate (p-sub) is used as the semiconductor substrate 30. A silicon substrate, for example, is used as the semiconductor substrate. The semiconductor substrate on which an element is formed may be a p-type well formed in an n-type substrate, or a p-type well formed in an n-type well included in a p-type substrate, as well as the p-type semiconductor substrate.

The active regions AA1 and the element isolation layers 23A, configured as a line-and-space pattern of the minimum feature size F, are provided in the region R1. The memory cell transistors MC are provided in the active regions AA1. The memory cell transistor MC has a stacked gate structure formed on the semiconductor substrate 30. The stacked gate structure includes a charge storage layer (floating gate electrode) 32A formed on the tunnel insulating film 31A, and a control gate electrode 34 formed on the floating gate electrode 32A via an intergate insulating film 33A. That is, the memory cell transistor MC of the present embodiment is a floating-gate-type memory cell transistor. The memory cell transistor MC varies in threshold voltage according to the number of electrons injected into the floating gate electrode, and stores data according to the difference in threshold voltage. The control gate electrode 34 functions as a word line WL. In the region R1, the memory cell transistors MC adjacent to each other in the row direction, in which direction the word line WL extend, are electrically isolated by the element isolation layer 23A.

The active region AA2 having a width of the minimum feature size F is provided in the boundary between the regions R1 and R2. A stacked gate structure same as that of the memory cell transistor MC is also disposed on the active region AA2. As described above, the transistor disposed in the active region AA2 has low reliability in operation, and therefore is not used as a memory cell.

The active regions AA3 and AA4, configured as a line-and-space pattern having a width greater than the minimum feature size F, and the element isolation layer 23C are provided in the region R2. The active regions AA2 and AA3 are electrically isolated from each other by the element isolation layer 23B having a width greater than that of the element isolation layer 23A.

A stacked gate structure same as that of the memory cell transistor MC is provided on the active region AA3. More specifically, the tunnel insulating film 31B, the floating gate electrode 32B, the intergate insulating film 33B, and the control gate electrode 34 are stacked in this order.

A gate structure same as that of the high-voltage MOSFET included in a peripheral circuit is provided on the active region AA4. More specifically, the gate insulating film 35, the tunnel insulating film 31B, the floating gate electrode 32B, the intergate insulating film 33B, and the control gate electrode 34 are stacked in this order. The position of the upper surface of the tunnel insulating film 31B is approximately same as the position of the upper surface of the tunnel insulating film 31A. The gate insulating film 35 is a gate insulating film for high voltages, and has a film thickness greater than that of the tunnel insulating film 31B. The upper surface of the active region AA4 is lower than the upper surface of the active region AA1 by the film thickness of the gate insulating film 35. The active regions AA3 and AA4 are electrically isolated by the element isolation layer 23C having a greater width than the element isolation layer 23A. It is to be noted that the gate insulating film 35 and the tunnel insulating film 31B may become integrally formed when they are stacked and cannot be recognized from each other.

Thus, in the region R2, after continuation of a predetermined number of line-and-space patterns (active regions and element isolation layers) having a width greater than the minimum feature size F, the insulating layer 20, for example, on which the electrode 21 is to be formed, is provided.

The region R3 is a peripheral circuit region where a sense amplifier, for example, is arranged. In the region R3, active regions AA5, configured as a line-and-space pattern with a width greater than the minimum feature size F, and the element isolation layers 40 are provided. In the active region AA5, a high-voltage MOSFET forming a peripheral circuit is disposed. More specifically, on the active region AA5, a gate insulating film 41 for high voltages, a tunnel insulating film 42, a floating gate electrode 43, an intergate insulating film 44, and a gate electrode 45 are stacked in this order. Since an opening is formed in the intergate insulation film 44, the floating gate electrode 43 and the gate electrode 45 are electrically connected, and integrally function as a gate electrode. At the opening of the intergate insulating film 44, an upper portion of the floating gate electrode 43 becomes hollow, and the gate electrode 45 is embedded in this hollow.

The upper surface of the floating gate electrode 43 contacting the lower surface of the intergate insulating film 44 is at the same position as the upper surface of the element isolation layer 40. Accordingly, the intergate insulating film 44 is formed approximately flat. The upper surface of the active region AA5 is lower than the upper surface of the active region AA1 by the film thickness of the gate insulating film 41. The gate insulating film 41 for high voltages, the tunnel insulating film 42, the floating gate electrode 43, and the intergate insulating film 44 are same as the MOSFET of the active region AA4, in terms of film thicknesses and the positions where they are formed. FIG. 4 shows only one active region AA5, but a plurality of active regions AA5 and a plurality of MOSFETs actually exist in the region R3.

In the memory cell transistor MC, the speed of writing operation can be increased by making the capacity C2 between the floating gate electrode and the control gate electrode greater than the capacity C1 between the substrate and the floating gate electrode, i.e., by increasing the coupling ratio. In the embodiment, the capacity C2 is increased and the coupling ratio is increased by increasing the area that the floating gate electrode 32A and the intergate insulating film 33A contact. The area that the floating gate electrode 32A and the intergate insulating film 33A contact can be adjusted by the height of the element isolation layer 23A. Accordingly, in the region R1 (memory cell array unit 11), the upper surface of the element isolation layer 23A is set low so as to be close to the bottom surface of the floating gate electrode 32A. For example, the upper surface of the element isolation layer 23A is set between (and including) the intermediate point and the bottom surface of the floating gate electrode 32.

In the active region AA3 having a width arranged in the region R2 (WL extracting portion 12) and greater than the minimum feature size F, the element isolation width is greater than the minimum feature size F. Since the etching speed the region R2 is faster than that of the region R1, when etching is performed according to the height of the element isolation layer of the region R1, the upper surfaces of the element isolation layers 23B and 23C become low. As the distance between the control gate electrode 34 and the semiconductor substrate 30 becomes short and a high electrical field is applied to the portion where the distance has become short, there is high possibility that a dielectric breakdown is caused in the tunnel insulating film 31. Accordingly, in the region R2, the upper surfaces of the element isolation layers 23B and 23C are set to be high so as to be closer to the upper surface of the floating gate electrode 32B using lithography for separating the region R1 and the region R2.

Further, when the width of the active region is greater than the minimum feature size F and the upper surfaces of the element isolation layers 23B and 23C become high in the region R2, the area that the intergate insulating film 33B and the floating gate electrode 32B contact becomes relatively small, compared to the cell transistor in the region R1, and the coupling ratio decreases. Thereby, the voltage of the floating gate electrode 32B does not increase much even when a high voltage is applied to the control gate electrode 34, and an electric field to be applied to the intergate insulating film 33B will increase. Accordingly, there is high possibility that a dielectric breakdown is caused in the intergate insulating film 33B in case an upper portion of the floating gate electrode 32B is angular, since an electric field is concentrated on the angular portion. Accordingly, in the region R2, the upper surfaces of the element isolation layers 23B and 23C are set slightly lower than the upper surface of the floating gate electrode 23B, and the corners of the floating gate electrode 32B are made round. For example, the upper surfaces of the element isolation layers 23B and 23C are set to be between (and not including) the intermediate point and the upper surface of the floating gate electrode 32B. That is, the upper surface of the element isolation layer of the region R2 (WL extracting portion 12) is set to be higher than the upper surface of the element isolation layer of the region R1 (memory cell array unit 11).

Thereby, in the region R1, the coupling ratio of the memory cell transistor MC can be optimized, whereas in the region R2, a dielectric breakdown can be prevented from both of the tunnel insulating film 31B and the intergate insulating film 33B.

The curvature radius of the floating gate electrode 32B in the region R2 is greater than the curvature radius of the floating gate electrode 43 in the region R3. This is because the step of making the corners of the floating gate electrode 43 round while setting the upper surface of the element isolation layer 40 to be slightly lower than the upper surface of the floating gate electrode 43 is not performed in the region R3. Accordingly, the position of the upper surface of the element isolation layer 40 is approximately the same as the upper surface of the floating gate electrode 43. Further, the upper surface of the element isolation layer 40 in the region R3 is higher than the upper surfaces of the element isolation layers 23B and 23C in the region R2.

Further, the upper portion of the floating gate electrode 32A of the active region AA2 arranged in the boundary between the region R1 and the region R2 is not angular but round. The floating gate electrode 32A on the active region AA2 has a shape different from that of the floating gate electrode 32A on the active region AA1, but there will be no problem since the floating gate electrode 32A is not used as a memory cell.

(Manufacturing Method)

Next, an example of a method of manufacturing the nonvolatile semiconductor memory device 10 according to the first embodiment will be described with reference to the accompanying drawings.

Figure 5:
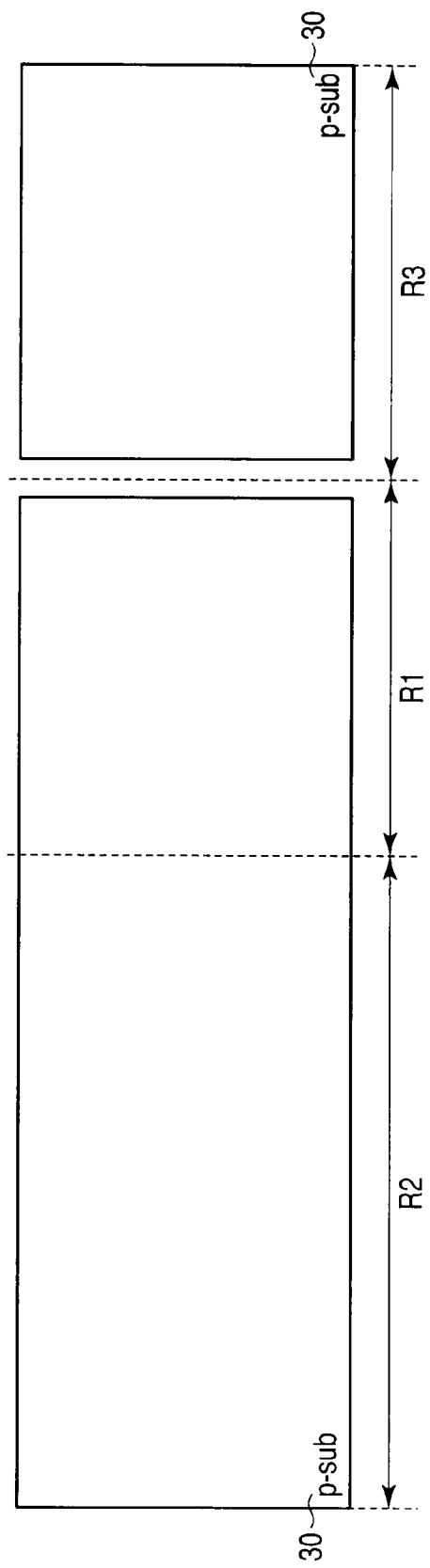
FIG. 5 is a cross-sectional view illustrating a nonvolatile semiconductor memory device 10 according to the first embodiment.

As shown in FIG. 5, a p-type semiconductor substrate 30 is prepared. The p-type semiconductor substrate 30 includes a region R1 in which the memory cell array unit 11 is formed, a region R2 in which the WL extracting portion 12 is formed, and a region R3 in which peripheral circuits (such as the row decoder 13) are formed.

Figure 6:
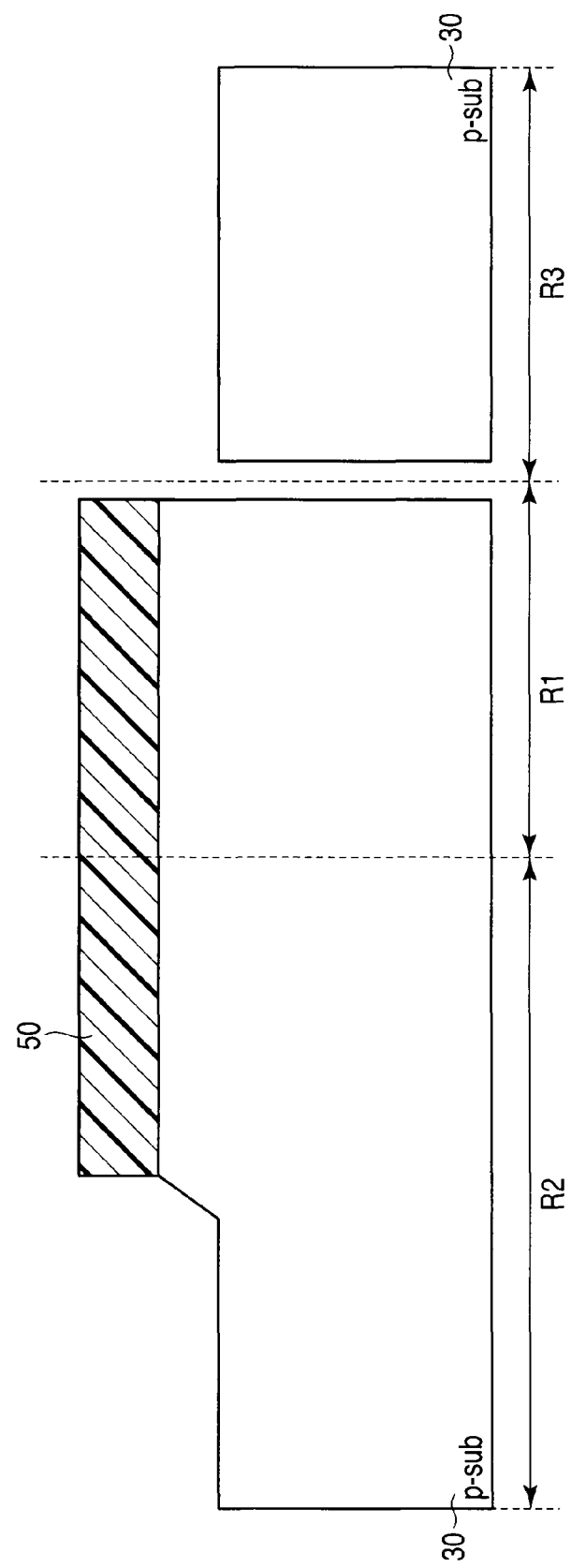
FIG. 6 is a cross-sectional view illustrating a manufacturing step of the nonvolatile semiconductor memory device 10 following FIG. 5.

A step is formed in the p-type semiconductor substrate 30 by lowering a region of the p-type semiconductor substrate 30 in which a gate insulating film for high voltages is to be formed. That is, as shown in FIG. 6, a resist layer 50 is formed on the p-type semiconductor substrate 30 so as to cover the entire region R1 and partially cover the region R2 through lithography. After that, the p-type semiconductor substrate 30 is lowered through a reactive ion etching (RIE) method, for example, using the resist layer 50 as a mask. After that, the resist layer 50 is removed.

Figure 7:
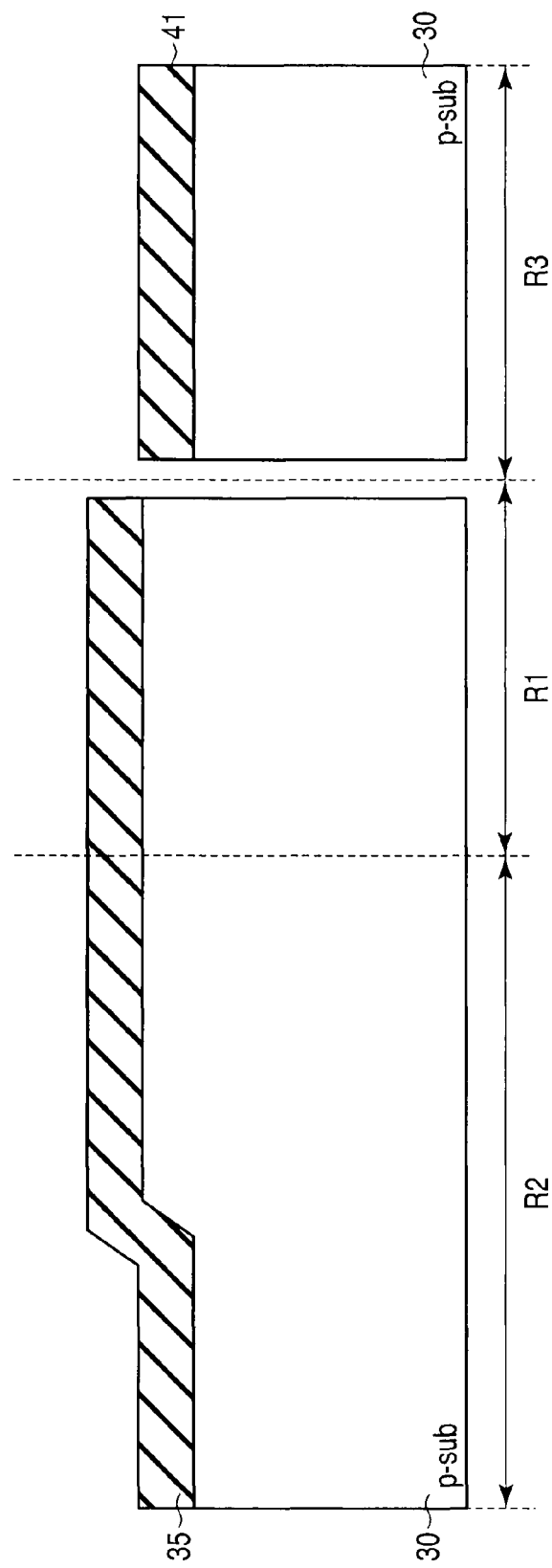
FIG. 7 is a cross-sectional view illustrating a manufacturing step of the nonvolatile semiconductor memory device 10 following FIG. 6.
Figure 8:
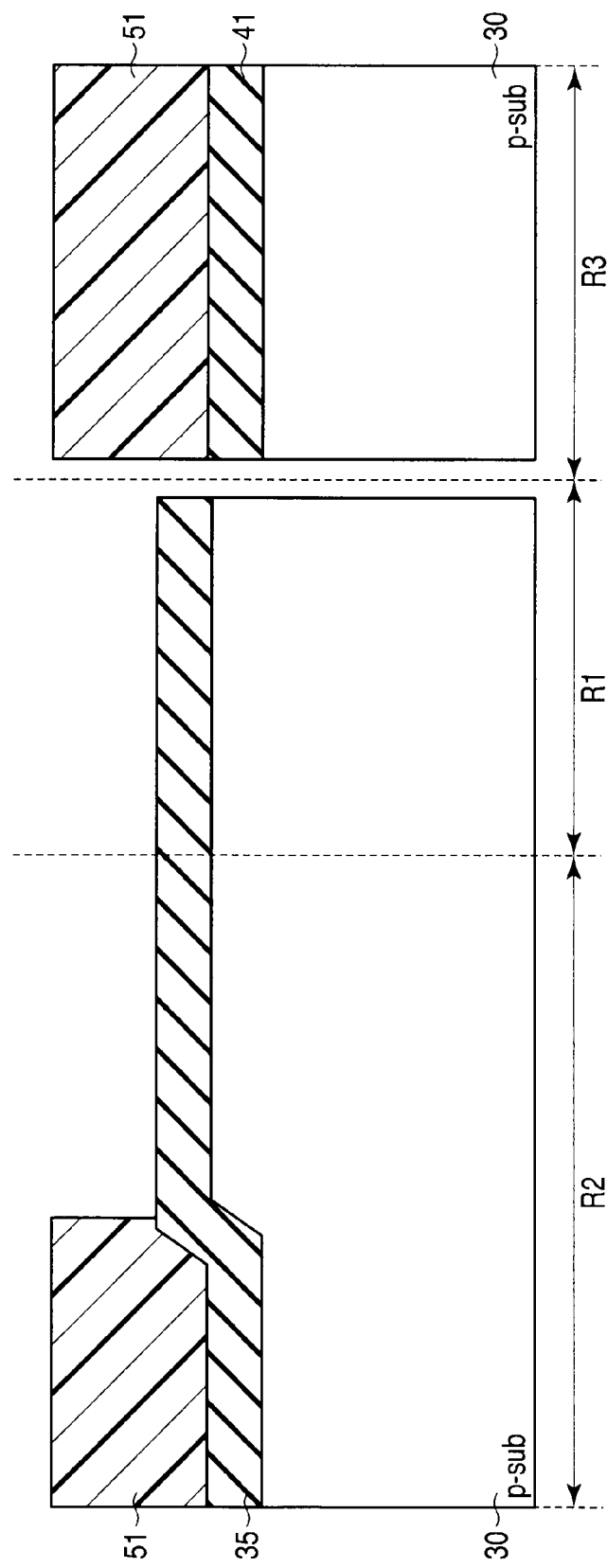
FIG. 8 is a cross-sectional view illustrating a manufacturing step of the nonvolatile semiconductor memory device 10 following FIG. 7.

As shown in FIG. 7, gate insulating films 35 and 41 for high voltages, formed of oxide films, for example, are formed on the entire surface of the device. As shown in FIG. 8, a resist layer 51 is formed on the lowered part of the region R2 and the entire surface of the region R3.

Figure 9:
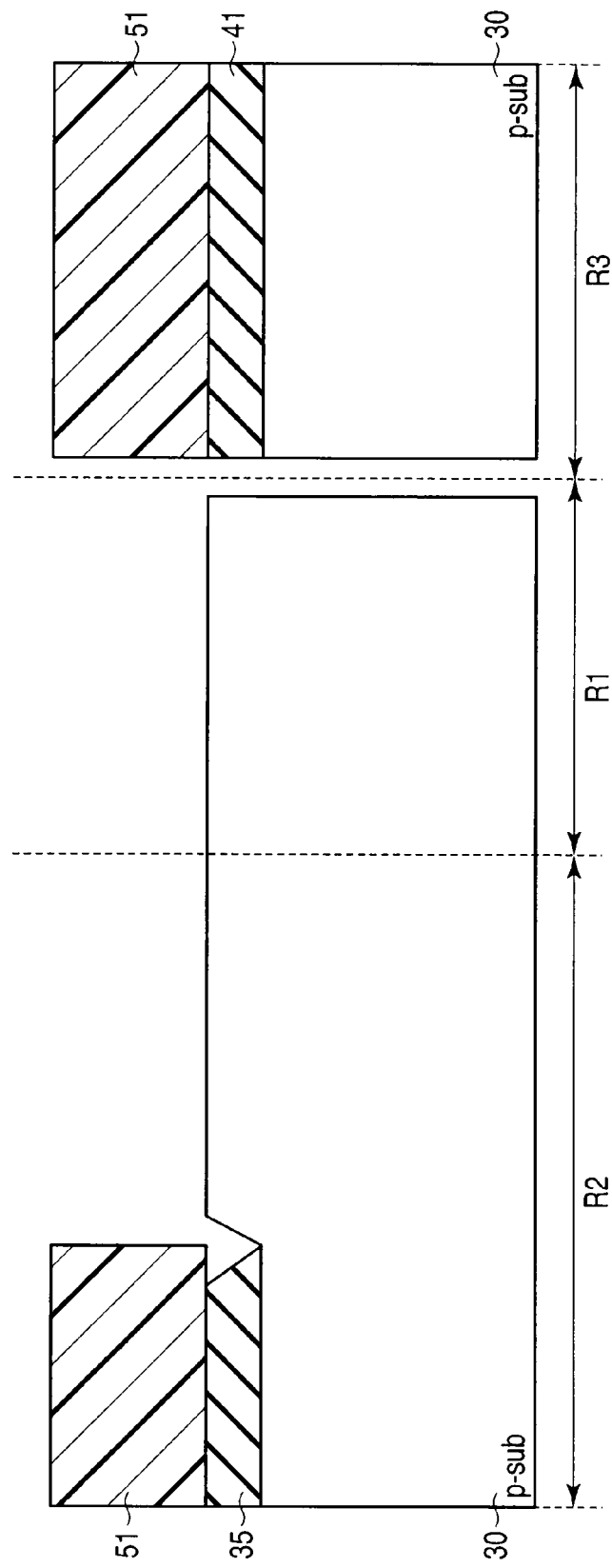
FIG. 9 is a cross-sectional view illustrating a manufacturing step of the nonvolatile semiconductor memory device 10 following FIG. 8.

As shown in FIG. 9, the gate insulating film 35 is partially etched through a RIE method, for example, using the resist layer 51 as a mask. In this case, when the gate insulating film 35 is removed using wet etching, a chemical solution enters below the resist layer 51, and the gate insulating film 35 positioned under the resist layer 51 is also partially removed. After that, the resist layer 51 is removed.

Figure 10:
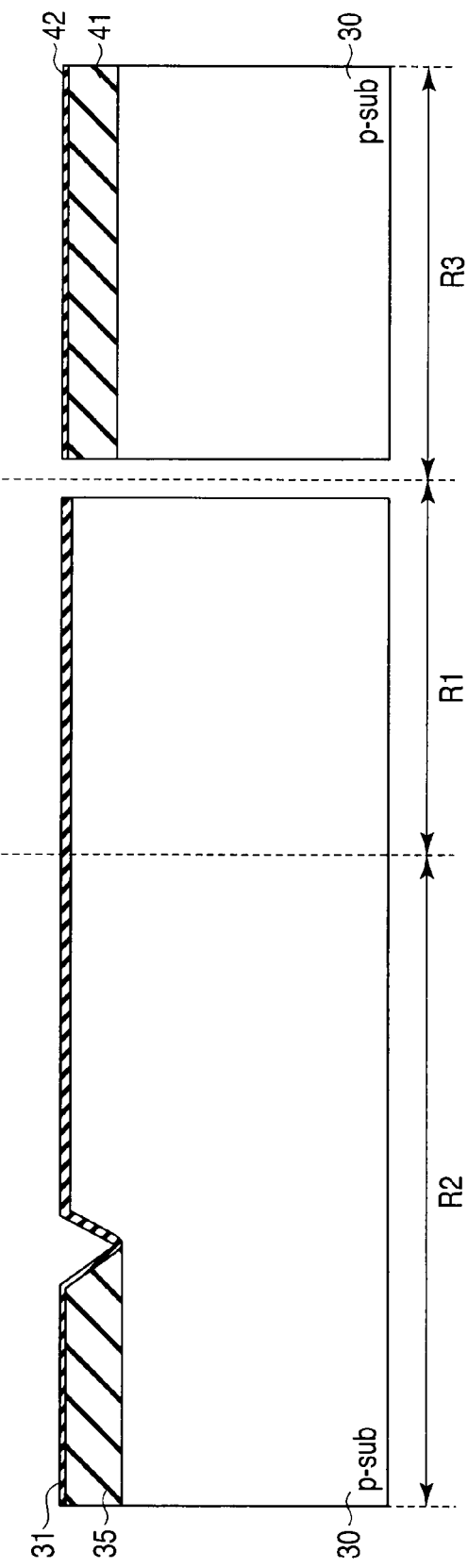
FIG. 10 is a cross-sectional view illustrating a manufacturing step of the nonvolatile semiconductor memory device 10 following FIG. 9.
Figure 11:
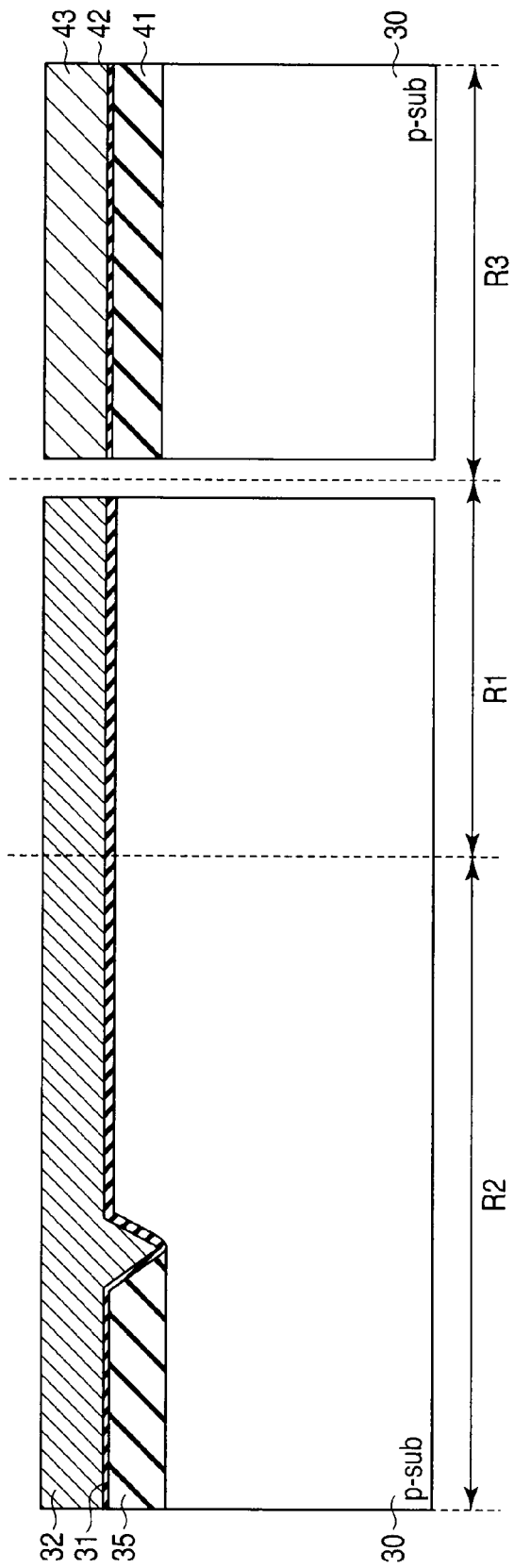
FIG. 11 is a cross-sectional view illustrating a manufacturing step of the nonvolatile semiconductor memory device 10 following FIG. 10.

As shown in FIG. 10, tunnel insulating films 31 and 42, formed of oxide films, for example, are formed on the entire surface in the region R1, R2 and R3. In this case, the gate insulating film 35 and the tunnel insulating film 31B may be integrally formed and may not be recognized from each other. As shown in FIG. 11, conductive layers 32 and 43, which are to be floating gate electrodes, are formed on the entire surface in the region R1, R2 and R3. Polysilicon doped with n-type impurities (such as phosphorous) or with p-type impurities (such as boron) is used as the conductive layers 32 and 43.

Figure 12:
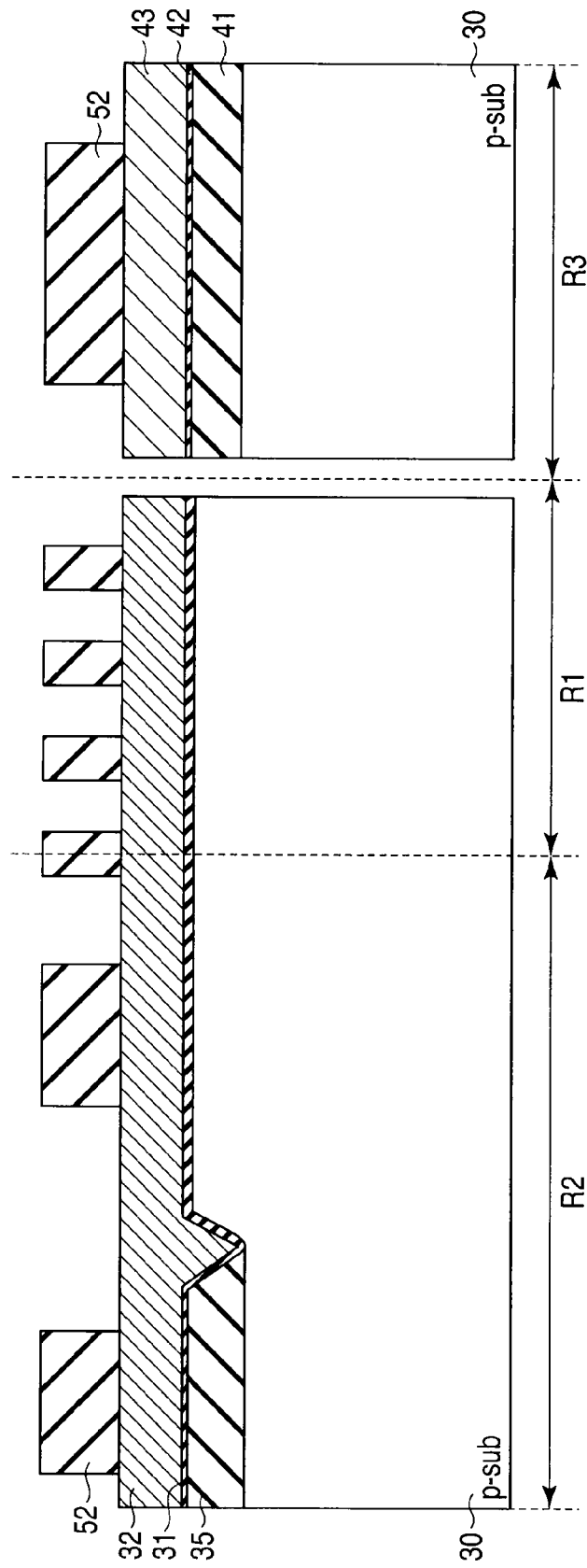
FIG. 12 is a cross-sectional view illustrating a manufacturing step of the nonvolatile semiconductor memory device 10 following FIG. 11.

As shown in FIG. 12, a hard mask layer 52 is formed on the conductive layers 32 and 43 through lithography and a RIE method on the conductive layers 32 and 43, so as to cover only the region in which an active region is to be formed. In this case, a hard mask layer 52 having a line-and-space pattern of the minimum feature size F is formed in the region R1, and a hard mask layer 52 having a line-and-space pattern with a width greater than the minimum feature size F is formed in the regions R2 and R3.

Figure 13:
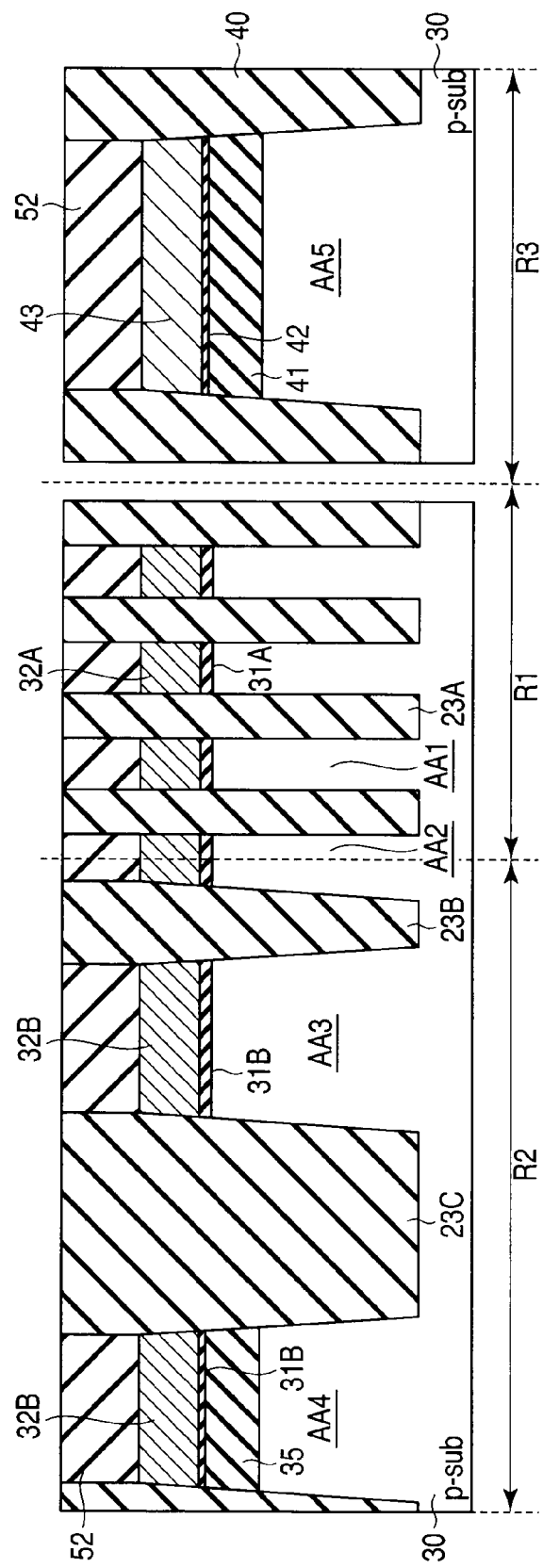
FIG. 13 is a cross-sectional view illustrating a manufacturing step of the nonvolatile semiconductor memory device 10 following FIG. 12.

As shown in FIG. 13, the conductive layer 32, the tunnel insulating film 31, the gate insulating film 35, and the semiconductor substrate 30 are etched through a RIE method, for example, using the hard mask layer 52 as a mask. At the same time, in the region R3, the conductive layer 42, the tunnel insulating film 42, the gate insulating film 41, and the semiconductor substrate 30 are etched. After that, an insulation material formed of an oxide, for example, is formed in the openings, so as to form element isolation layers 23 (23A-23C) and 40. At the same time as the formation of the element isolation layers 23 and 40, the active regions AA1-AA5 are formed. After that, the upper surface of the device is planarized through a chemical mechanical polishing (CMP) method, using the hard mask layer 52 as a stopper.

Figure 14:
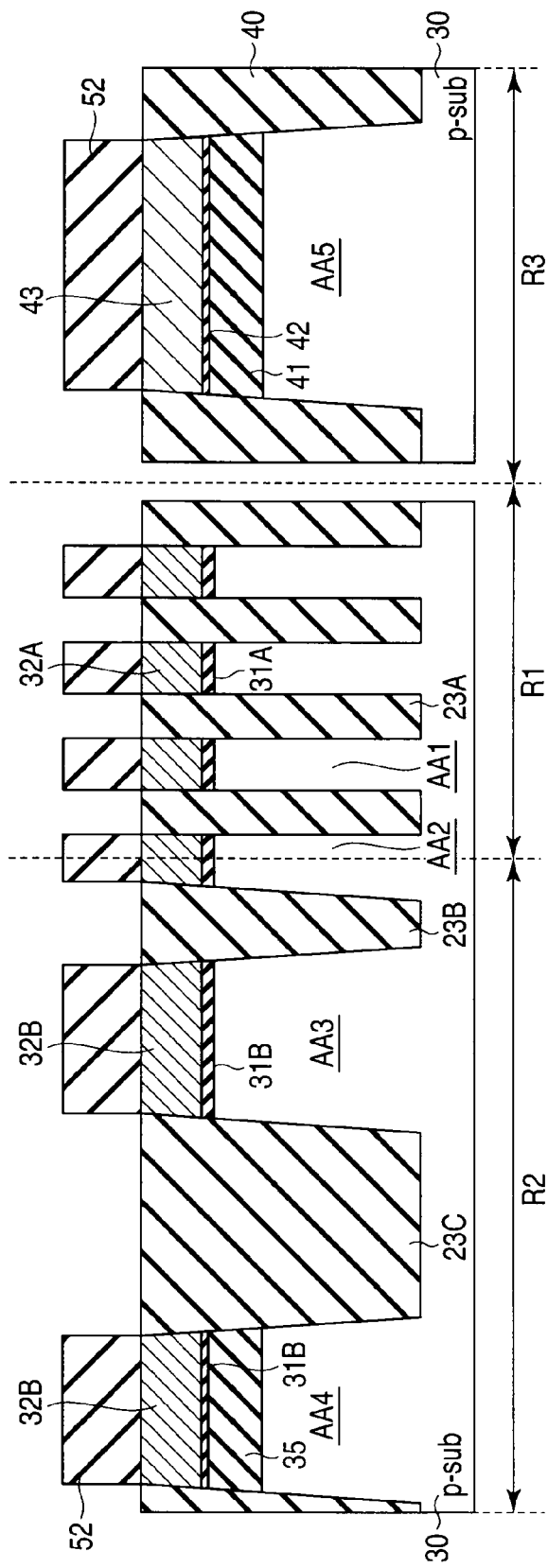
FIG. 14 is a cross-sectional view illustrating a manufacturing step of the nonvolatile semiconductor memory device 10 following FIG. 13.
Figure 15:
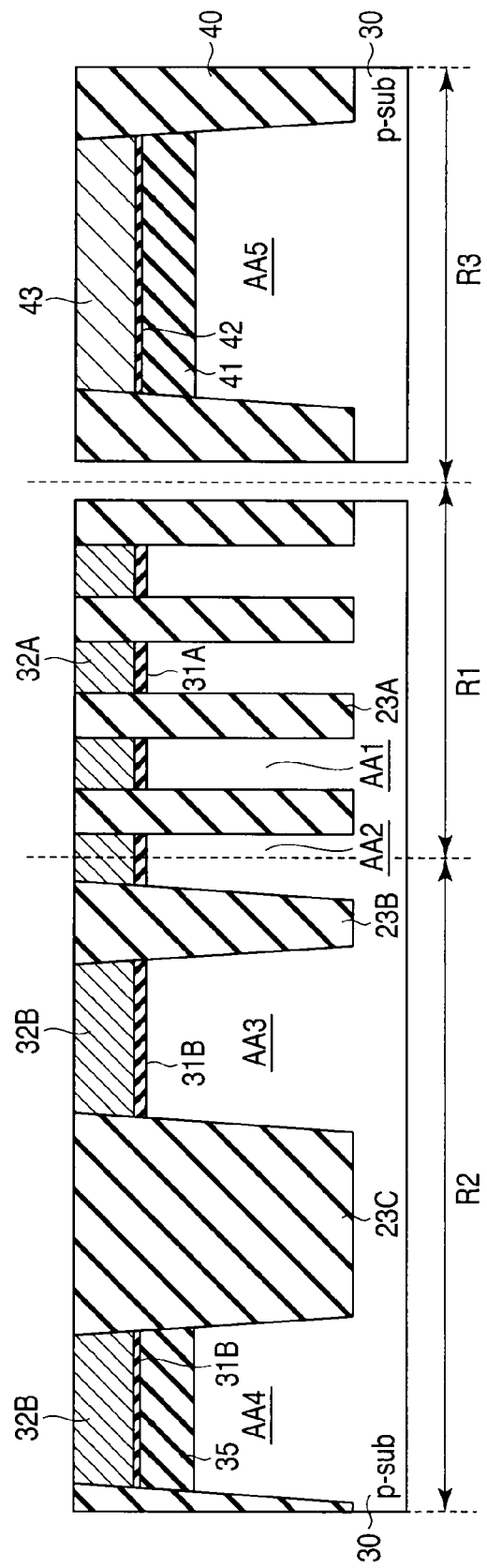
FIG. 15 is a cross-sectional view illustrating a manufacturing step of the nonvolatile semiconductor memory device 10 following FIG. 14.

As shown in FIG. 14, the element isolation layers 23 and 40 are etched back using a RIE method or wet etching, until the upper surfaces of the element isolation layers 23 and 40 become approximately at the same position as that of the upper surface of the floating gate electrode 32. As shown in FIG. 15, the hard mask layer 52 is removed.

Figure 16:
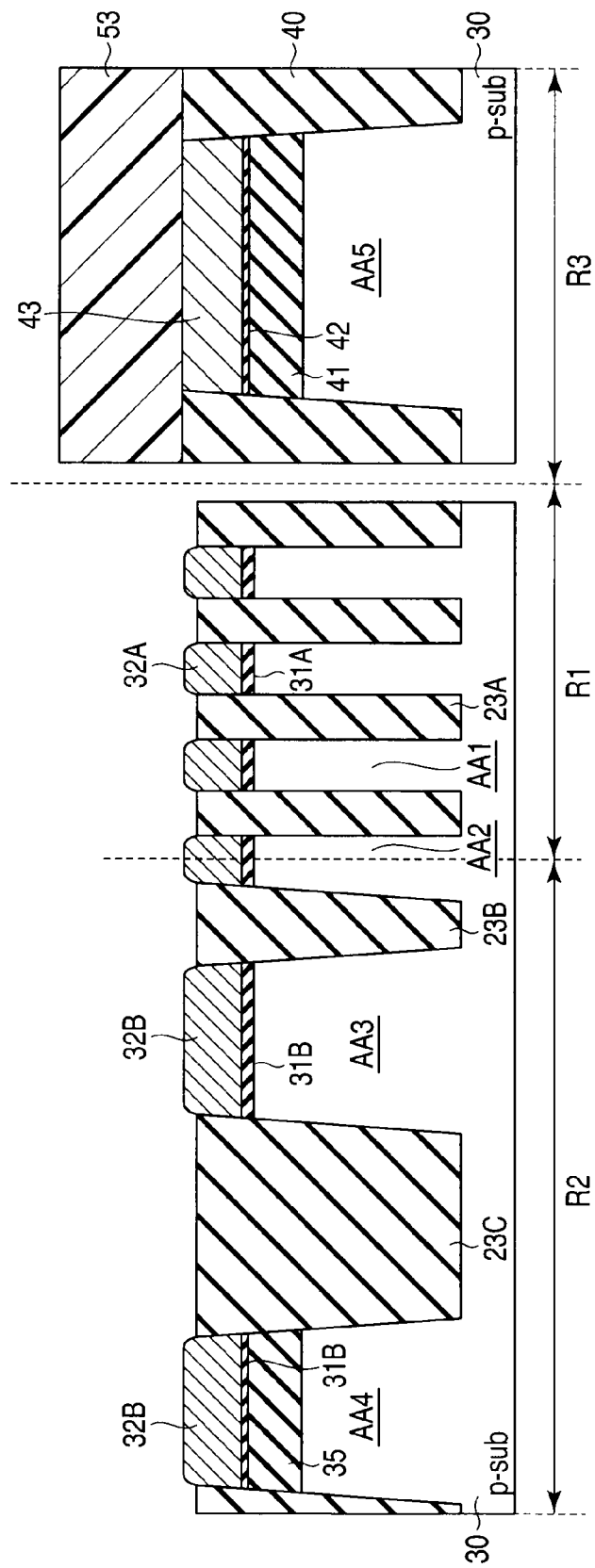
FIG. 16 is a cross-sectional view illustrating a manufacturing step of the nonvolatile semiconductor memory device 10 following FIG. 15.

As shown in FIG. 16, the region R3 is coated with a resist layer 53. After that, the element isolation layer 23 of the regions R1 and R2 are lowered such that the upper surfaces of the element isolation layer 23 in the regions R1 and R2 become between (and not including) the intermediate point and the upper surface of the floating gate electrode 32. In this case, corners of upper portions of the floating gate electrodes 32 of the regions R1 and R2 become round.

Figure 17:
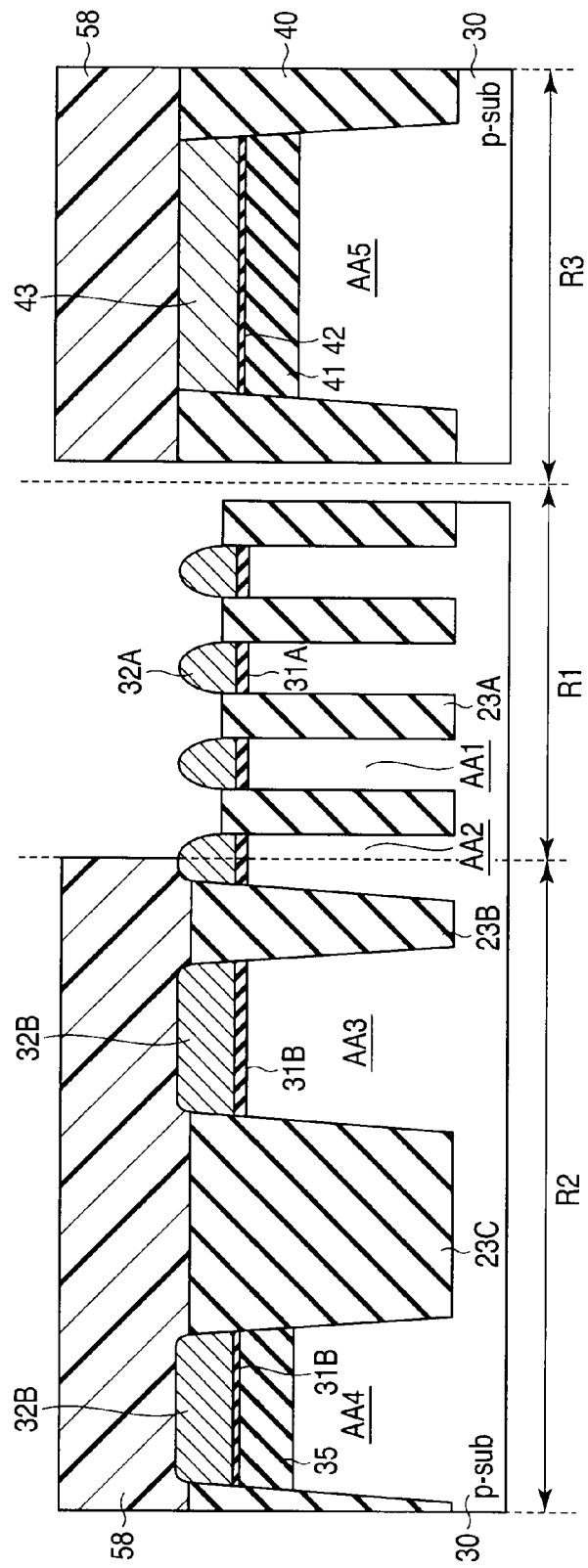
FIG. 17 is a cross-sectional view illustrating a manufacturing step of the nonvolatile semiconductor memory device 10 following FIG. 16.

As shown in FIG. 17, the regions R2 and R3 are coated with a resist layer 58 after the resist layer 53 is removed. After that, the element isolation layer 23A in the region R1 is lowered through a RIE method or a wet etching method, for example, such that the upper surface of the element isolation layer 23A in the region R1 becomes between the intermediate point and the bottom surface of the floating gate electrode 32A. The element isolation layers 23B and 23C of the region R2 are set to be higher than the element isolation layer 23A of the region R1 by 15 nm, for example. In this case, corners of the upper portions of the floating gate electrodes 32A of the region R1 are more rounded than those of the floating gate electrodes 32B of the region R2.

Figure 18:
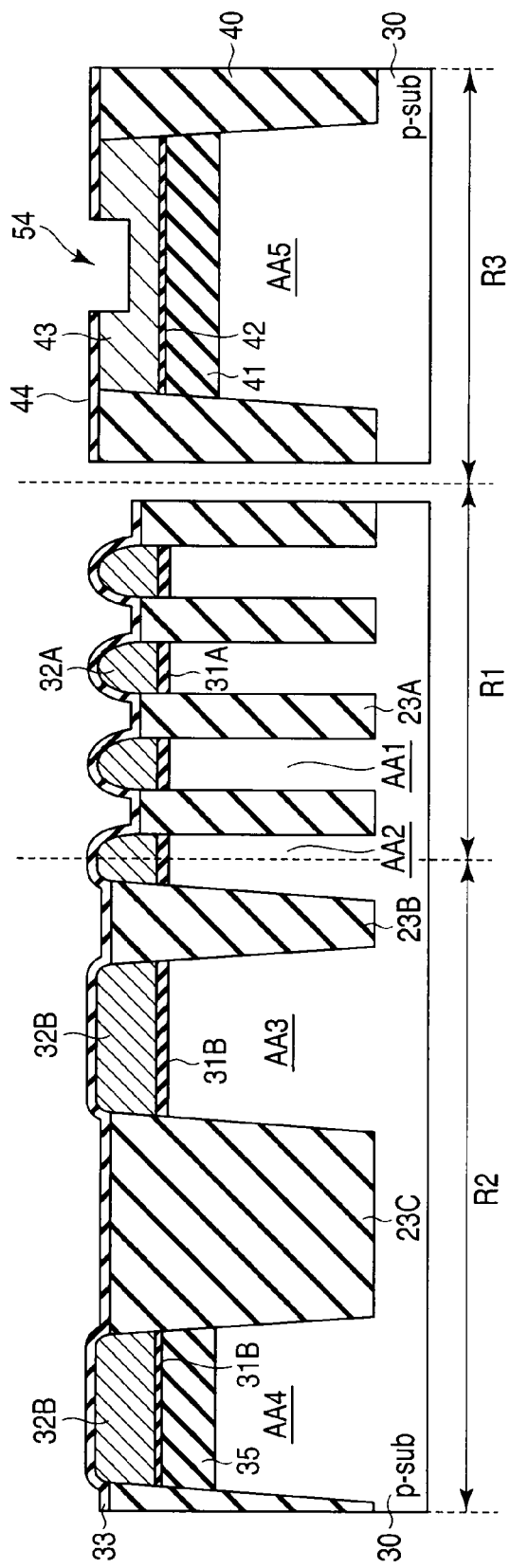
FIG. 18 is a cross-sectional view illustrating a manufacturing step of the nonvolatile semiconductor memory device 10 following FIG. 17.

As shown in FIG. 18, intergate insulating films 33 and 44 are formed on the entire surface in the region R1, R2 and R3. An oxide film or a stacked film including an oxide film, a nitride film, and an oxide film (ONO stack film) is used as the intergate insulating films 33 and 44. After that, a slit 54 is formed in the intergate insulating film 44, so as to partially expose the floating gate electrode 43. In this slit formation, overetching is performed so as to reliably remove the intergate insulating film 44. Thereby, a hollow is formed in an upper portion of the floating gate electrode 43.

As shown in FIG. 19, an electrode material, which is to be a control gate electrode 34 and a gate electrode 45, is deposited on the entire surface of the device. A metal electrode or polysilicon is used as the electrode material. After that, the electrode material is processed through lithography and a RIE method, and a plurality of control gate electrodes 34 extending in the row direction are formed. In the step of processing the control gate electrode 34, the floating gate electrodes 32 are processed simultaneously, and the floating gate electrodes 32 are electrically isolated in the column direction. Further, the gate electrode 45 and the floating gate electrode 43 are also processed into a desired shape.

After an impurity introduction step, a MOSFET diffusion region is formed in the active region. After that, after a formation step of an interlayer insulating layer and a wiring step as in a general large-scale integrated circuit (LSI) manufacturing process are performed, and then a nonvolatile semiconductor memory device including a floating-gate-type memory cell transistor is completed.

Next, a concern that may arise when a floating-gate-type memory cell transistor is used and countermeasure against it will be described, with reference to FIGS. 20-23. The concern is due to a shortage between a dummy word line and a selection gate line, which becomes a problem in the floating-gate type.

Since the selection transistor ST (ST1 or ST2) is a transistor having a certain threshold voltage, the intergate insulating film 44 as included in the memory cell transistor MC is not needed. Accordingly, a gate electrode is formed after intergate insulating film is removed only from the region in which a selection transistor ST is to be formed, such that the control gate electrode and the floating gate electrode are electrically connected. Thereby, the selection transistor ST is formed of a MOSFET that operates actually using only the tunnel oxide film as a gate insulating film.

Figure 20:
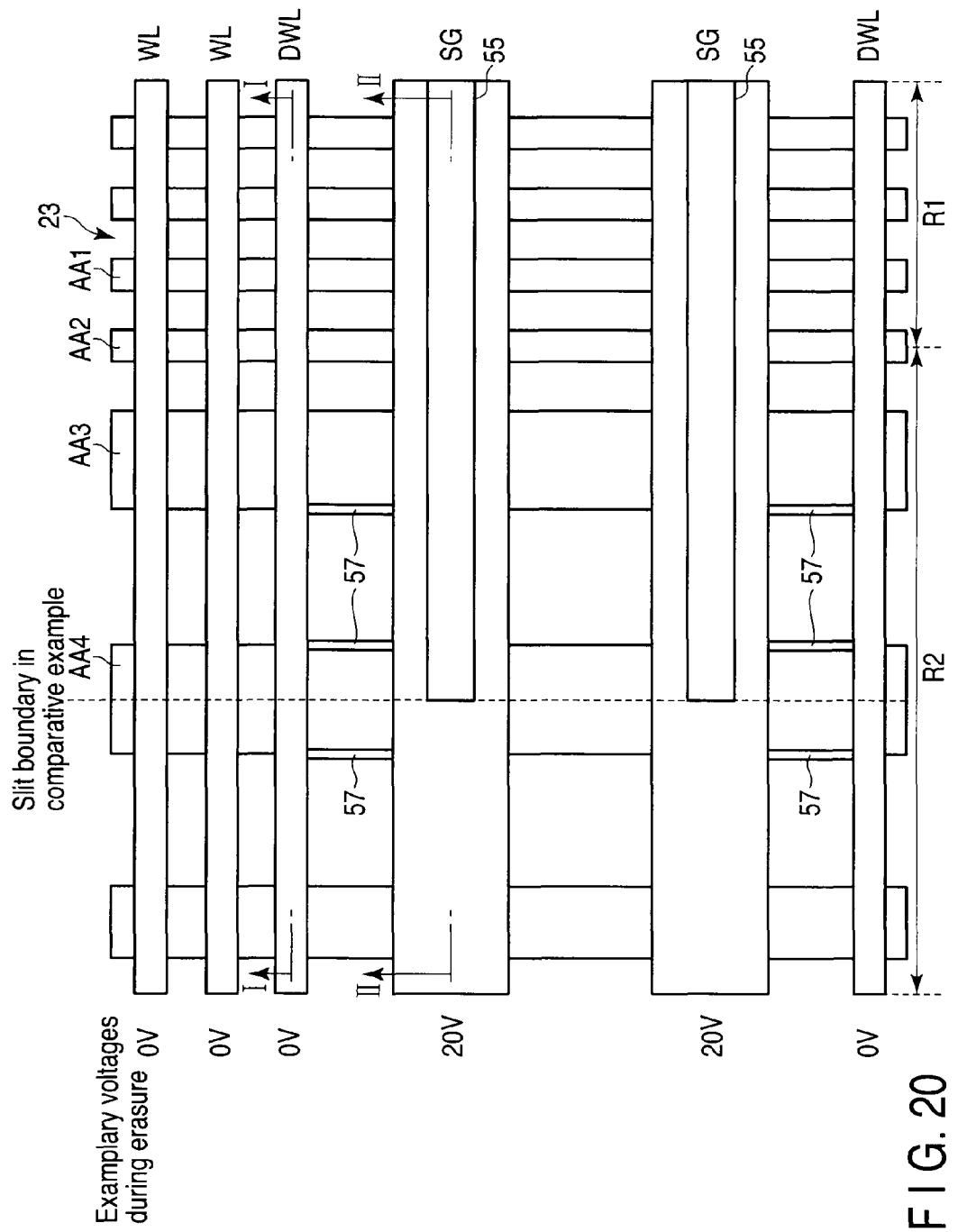
FIG. 20 is a layout chart of an array end according to a comparative example.
Figures 21A, 21B:
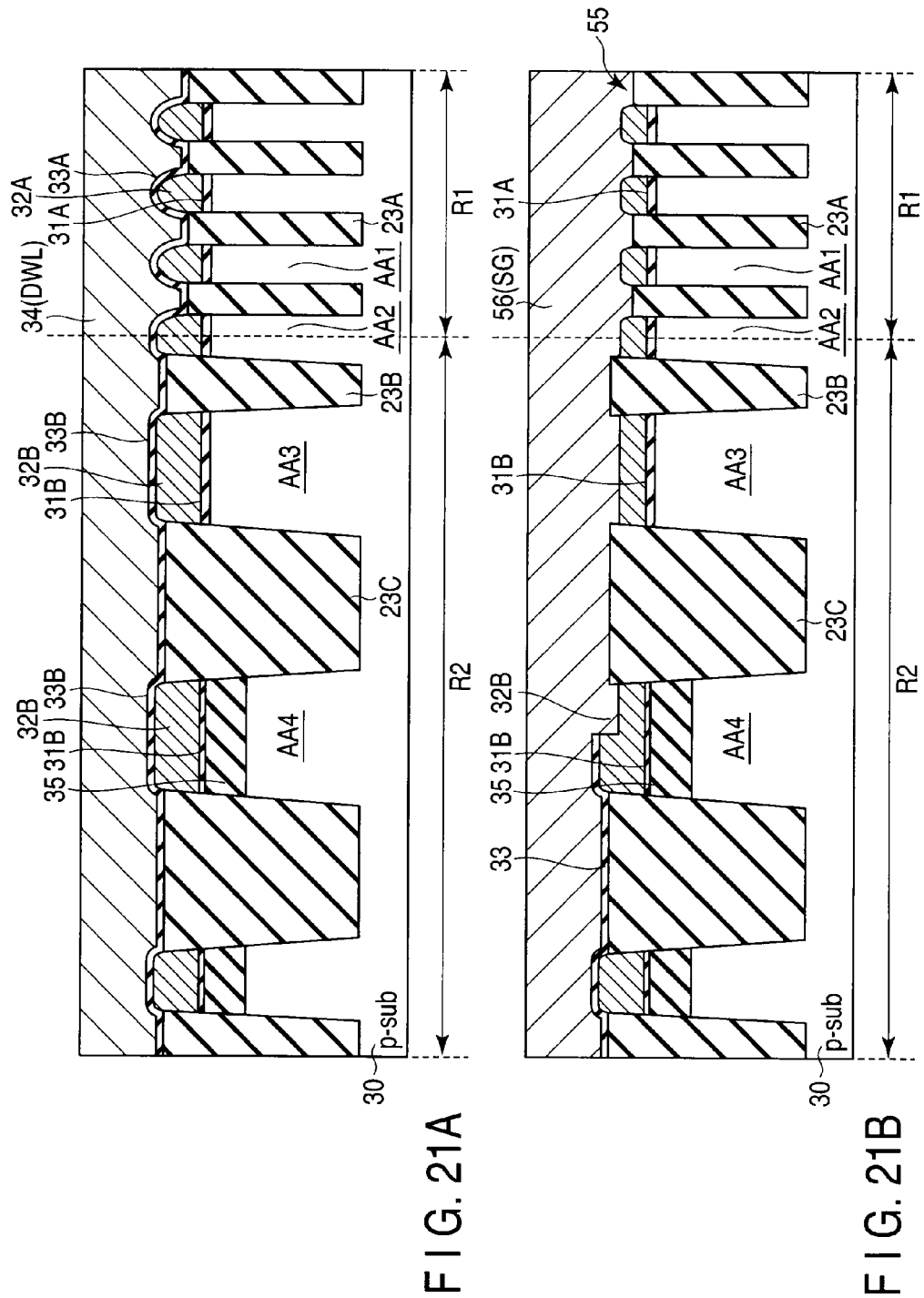
FIGS. 21A and 21B are cross-sectional views of the array end shown in FIG. 20.

FIG. 20 is a layout chart of an array end according to a comparative example. FIG. 21A is a cross-sectional view cut along the dummy word line DWL of FIG. 20, i.e., a cross-sectional view along line I-I of FIG. 20. FIG. 21B is a cross-sectional view along the selection gate line SG (SGD or SGS) of FIG. 20, i.e., a cross-sectional view along line II-II of FIG. 20. In the example of FIG. 20, a dummy word line DWL is provided between the word line WL and the selection gate line SG.

The selection gate line SG extends in the row direction from the region R1, as in the case of the word line WL, and is extracted up to the region R2. The selection gate line SG is electrically connected to an electrode (not shown) in the region R2, and is connected to the peripheral circuit via the electrode.

The cross-sectional view of FIG. 21A is the same as the cross-sectional view along the word line WL. Accordingly, as in the case of the memory cell transistor MC, an intergate insulating film 33 is provided between the floating gate electrode 32 and the control gate electrode 34 so as to electrically separate them.

In the gate electrode 56, corresponding to the selection gate line SG shown in the cross-sectional view of FIG. 21B, the slit 55 of the intergate insulating film 33 is formed so as to extend up to the active region AA4, for example, in the region R2 from the region R1. In the region of the slit 55, a first electrode formed of the same material as that of the floating gate electrode, and a second electrode formed of the same material as that of the control gate electrode are electrically connected, and thereby the gate electrode 56 is formed.

In the step of manufacturing an active region through lithography, side surfaces are processed approximately perpendicularly in the active region AA1 having a width of the minimum feature size F, whereas the active regions AA3 and AA4 with a greater width have a tapered shape. After that, the word line WL and the selection gate line SG is processed. In this step, the floating gate electrodes are also isolated along the word line WL and the selection gate line SG. In the active region having a tapered shape, however, the intergate insulating film formed on side surfaces of the tapered portion is not completely removed in case the intergate insulating film and the floating gate electrode are partially etched. Accordingly, the part of the floating gate electrode below the remaining intergate insulating film remains without being etched, and a floating gate electrode residual 57 may be formed between the dummy word line DWL and the selection gate line SG, as shown in FIG. 20.

Accordingly, if the slit 55 is formed on the active regions AA3 and AA4 having a great width, the selection gate line SG and the floating gate electrode 32B below the dummy word line DWL may be short-circuited via the floating gate electrode residual 57. When data is erased, a voltage of 0 V, for example, is applied to the dummy word line DWL, and an erasure voltage (of 20 V, for example) is applied to the selection gate line SG. Accordingly, a voltage of 0 V is applied to the control gate electrode 34, a voltage of 20 V is applied to the floating gate electrode 32B, and a voltage of 20 V is applied to the intergate insulating film 33B, and a dielectric breakdown in the intergate insulating film 33B may occur.

Figure 22:
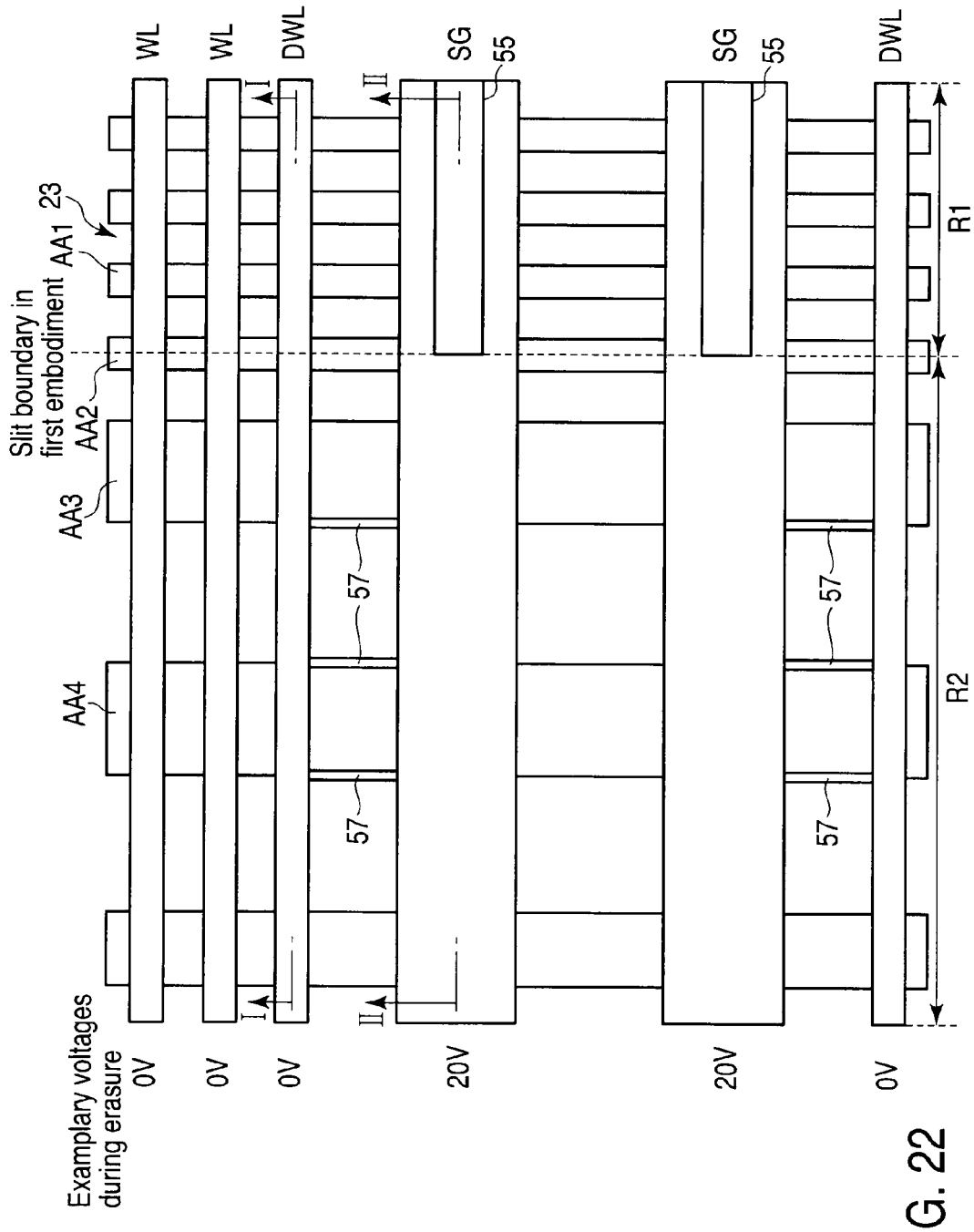
FIG. 22 is a layout chart of an array end according to the first embodiment.
Figures 23A, 23B:
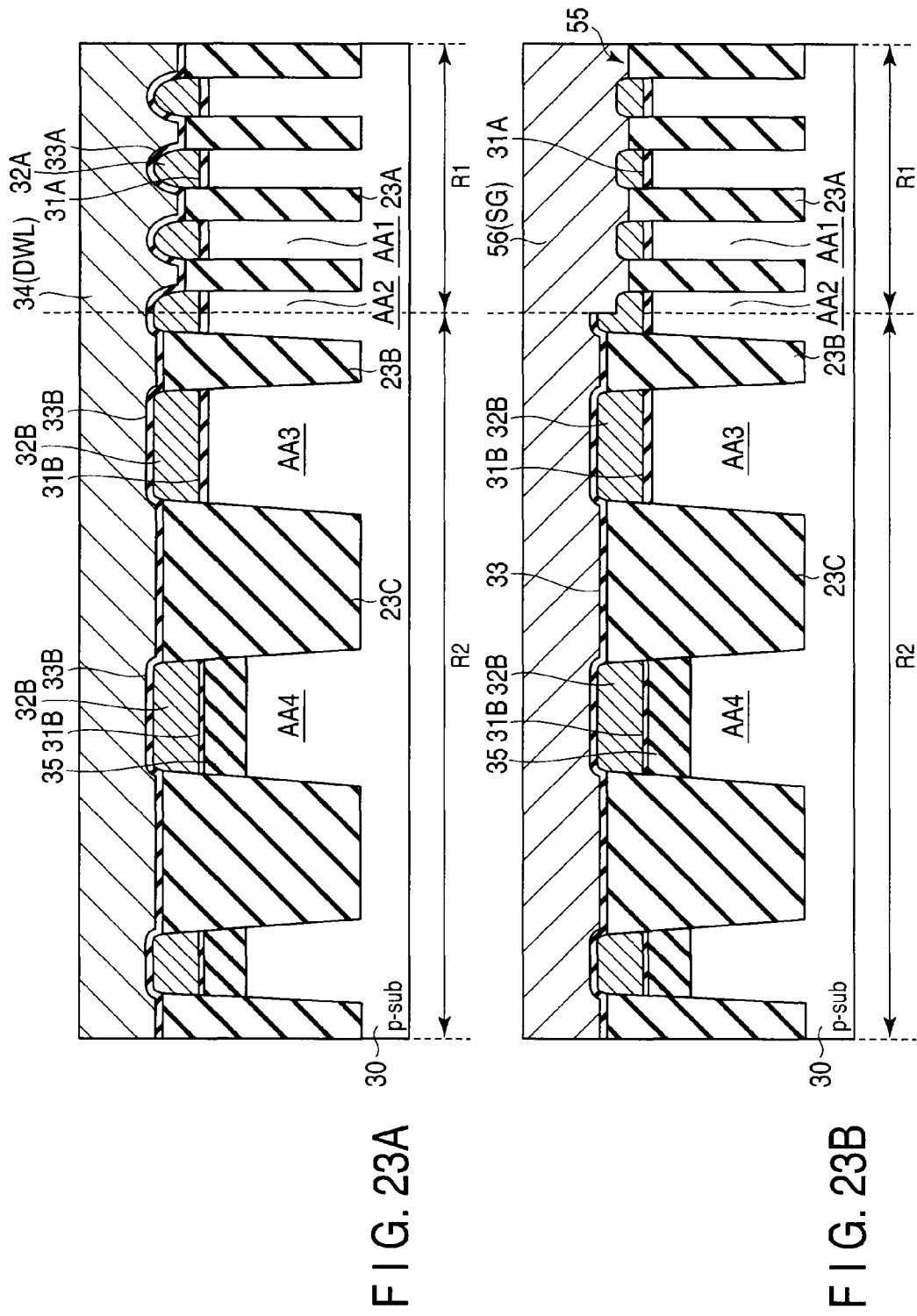
FIGS. 23A and 23B are cross-sectional views of an array end shown in FIG. 22.

In order to solve this problem, in the first embodiment, an end of the slit 55 corresponds with the boundary of the lowered element isolation layers, i.e., the boundary between the region R1 and the region R2 (on the active region AA2 having a width of the minimum feature size F). FIG. 22 is a layout chart of an array end according to the first embodiment. FIG. 23A is a cross-sectional view along line I-I of FIG. 22, and FIG. 23B is a cross-sectional view along line II-II of FIG. 22.

As shown in FIG. 22, if the end of the slit 55 corresponds with the boundary of the lowered element isolation layers, even when the floating gate electrode residual 57, which causes the selection gate line SG and the floating gate electrode 32B below the dummy word line DWL to be short-circuited, is formed, the floating gate electrode is in a floating state at the array end of both of the selection gate line SG and the dummy word line DWL. Accordingly, it is possible to prevent that, for example, a voltage of 20 V is applied to the intergate insulating film 33B when data is erased. Accordingly, it is possible to prevent a dielectric breakdown in the intergate insulating film 33B below the dummy word line DWL. This results in improving the breakdown voltage of the WL extracting portion 12.

It is to be noted that the position of the end of the slit 55 is only provided on the side closer to the region R1 than the active region AA3, and closer to the region R2 than the device region AA1 in the row direction. That is, if the position of the end of the slit 55 is closer to the region R1 than the active region AA3, the selection gate line SG and the floating gate electrode 32B below the dummy word line DWL will be prevented by the floating gate electrode residual 57 from being connected. Further, in case the position at the end of the slit 55 is closer to the region R2 than the active region AA1, the floating gate electrode 32A on the active region AA1 and the gate electrode 56 can be connected, and can be functioned as a selection transistor.

(Effects)

As described above, according to the first embodiment, the nonvolatile semiconductor memory device 10 comprises a region R1, in which the memory cell array unit 11 is arranged and which includes an active region with a width of the minimum feature size F, and a region R2, in which the WL extracting portion 12 configured to extract the word line WL provided in the memory cell array unit 11 is arranged, and including an active region having a width greater than the minimum feature size F. In the region R1, the element isolation layer is lowered to a large depth such that the contact area between the floating gate electrode and the intergate insulating film increases. In the region R2, the element isolation layer is lowered to a small depth such that the distance between the active region and the control gate electrode increases and the corners of the upper portion of the floating gate electrode are rounded.

Thus, according to the first embodiment, since the coupling ratio of the memory cell transistor MC can be increased, the operation speed of the memory cell transistor MC can be enhanced, and various operation voltages that area applied to the word line WL can be set low. Further, in the region R2, since the distance between the control gate electrode and the active region can be large, the breakdown voltage of the tunnel insulating film can be improved.

Further, in the region R1, since the corners of the upper portion of the floating gate electrode can be rounded by a RIE method when the element isolation layer is lowered, partial concentration of an electric field to the intergate insulating film can be prevented. Thereby, breakdown voltage of the intergate insulating film can be improved.

Further, the end of the slit formed in the intergate insulating film so as to electrically connect the first electrode formed of the material same as that of the floating gate electrode and the second electrode formed of the material same as that of the control gate electrode in the selection gate line SG corresponds with the boundary of the lowered element isolation layers, i.e., the boundary between the region R1 and the region R2. Thereby, even when a floating gate electrode residual that causes a short circuit between the floating gate electrode below the selection gate line SG and a floating gate electrode below the dummy word line DWL, a high voltage (of 20V, for example) will not be applied to the intergate insulating film when data is erased. Thereby, breakdown voltage of the WL extracting portion 12 can be improved.

Second Embodiment

A metal oxide nitride oxide semiconductor (MONOS)-type memory cell transistor, which uses an insulating film that traps charges as a charge storage layer, is known as a memory cell transistor used as a flash memory. The second embodiment is a configuration example in which the first embodiment is applied to the MONOS-type memory cell transistor.

FIG. 24 is a cross-sectional view of a memory cell array unit 11 and a WL extracting portion 12 along a word line, according to the second embodiment.

In a region R1, an active region AA1, configured as a line-and-space pattern of a minimum feature size F, and an element isolation layer 23A are provided. In the active region AA1, a memory cell transistor MC is provided. The memory cell transistor MC has a stacked gate structure formed on the semiconductor substrate 30. The stacked gate structure includes a charge storage layer 32A disposed on the tunnel insulating film 31A and a control gate electrode 34 disposed on the charge storage layer 32A via a block insulating film 33A. The memory cell transistor MC of the present embodiment is a MONOS-type memory cell transistor, and an insulating material such as a nitride film is used as the charge storage layer 32A. The memory cell transistor MC varies in threshold voltage according to the number of electrons trapped in the charge storage layer 32A, and stores data according to the difference in threshold voltage. The control gate electrode 34 functions as a word line WL. In the region R1, memory cell transistors MC adjacent to the row direction, in which the word line WL extends, are electrically isolated by the element isolation layer 23A.

In the boundary between the region R1 and the region R2, there is provided an active region AA2 having a width of the minimum feature size F. The stacked gate structure same as that of the memory cell transistor MC is also formed on the active region AA2.

In the region R2, active regions AA3 and AA4, configured as a line-and-space pattern having a width greater than the minimum feature size F, and element isolation layers 23C are provided. The active regions AA2 and AA3 are electrically isolated by the element isolation layer 23B having a width greater than the element isolation layer 23A.

A stacked gate structure same as that of the memory cell transistor MC is provided on the active region AA3. More specifically, a tunnel insulating film 31B, a charge storage layer 32B, a block insulating film 33B, and a control gate electrode 34 are stacked in this order.

On the active region AA4, a stacked gate structure including a gate insulating film 35 for high voltages is provided. More specifically, a gate insulating film 35, a tunnel insulating film 31B, a charge storage layer 32B, a block insulating film 33B, and a control gate electrode 34 are stacked in this order. The position of the upper surface of the tunnel insulating film 31B is the same as the position of the upper surface of the tunnel insulating film 31A. The upper surface of the active region AA4 is lower than the upper surface of the active region AA1 by the film thickness of the gate insulating film 35. The active region AA3 and the active region AA4 are electrically isolated by the element isolation layer 23C having a width greater than the element isolation layer 23A.

Thus, in the region R2, after continuation of a predetermined number of line-and-space patterns (active region and element isolation layer) having a width greater than the minimum feature size F, an insulating layer 20, for example, on which an electrode 21 is to be formed, is arranged.

The region R3 is a peripheral circuit region in which a sense amplifier, for example, is arranged. In the region R3, active regions AA5 configured as a line-and-space pattern having a width greater than the minimum feature size F, and element isolation layers 40 are provided. In the active region AA5, a high-voltage MOSFET included in a peripheral circuit is disposed. More specifically, on the active region AA5, a high-voltage gate insulating film 41, a first gate electrode 43, and a second gate electrode 45 are stacked in this order. The first gate electrode 43 and the second gate electrode 45 are electrically connected, and they integrally function as a gate electrode. The upper surface of the first gate electrode 43 is approximately the same as the position of the upper surface of the element isolation layer 40. Further, the upper surface of the element isolation layer 40 is higher than the upper surface of the element isolation layers 23B and 23C in the region R2. The upper surface of the active region AA5 is lower than the upper surface of the active region AA1 by the film thickness of the gate insulating film 41. FIG. 24 shows only one active region AA5, but a plurality of active regions AA5 and MOSFETs actually exist in the region R3.

In the memory cell transistor MC, an electric field applied to the tunnel insulating film when data is written and erased is set high, so as to obtain appropriate writing and erasing properties. For that purpose, the element isolation layer 23A is deeply lowered. For example, the upper surface of the element isolation layer 23A is the same as the upper surface of the charge storage layer 32A.

On the other hand, in the region R2 (WL extracting portion 12), when the element isolation layer is deeply lowered, the distance between the control gate electrode 34 and the semiconductor substrate 30 becomes small. In this case, there is high possibility that a high electric field is applied to the portion where the distance is small and a dielectric breakdown is caused in the tunnel insulating film 31B and the block insulating film 33B. Accordingly, in the region R2, the upper surfaces of the element isolation layer 23B and 23C are set to be higher than the upper surface of the element isolation layer 23A. The element isolation layers 23B and 23C are set to be higher than the element isolation layer 23A by 5 nm, for example. Further, the upper surfaces of the element isolation layers 23B and 23C are set to be higher than the upper surface of the charge storage layer 32B.

Thereby, in the region R1, the tunnel electric field of the memory cell transistor MC can be optimized, whereas in the region R2, a dielectric breakdown is prevented from occurring in the tunnel insulating film 31B and the block insulating film 33B.

(Manufacturing Method)

An exemplary manufacturing method of the semiconductor memory device 10 according to the second embodiment will be described below. The tunnel insulating film 31 (an oxide film in general), the charge storage layer 32 (nitride film in general), and a hard mask layer for STI processing are formed in this order on a p-type semiconductor substrate 30, and the hard mask layers are patterned through lithography. The hard mask layers of the region R1 have a line-and-space pattern having a width of the minimum feature size F, and the hard mask layers of the region R2 have a line-and-space pattern having a width greater than the minimum feature size F. The active regions are then patterned. That is, the mask layers, the charge storage layer 32, the tunnel insulating film 31, and the semiconductor substrate 30 are etched so as to form element isolation layers in the trenches.

After that, the entire surface of the device is planarized using a CMP method, and then element isolation layers are lowered. In the present embodiment, a resist layer is formed through lithography, so as to expose only the region R2. After that, the element isolation layers 23B and 23C of the region R2 are lowered to a desired depth. After that, the element isolation layers 23A are lowered to a great depth only in the region R1, such that the element isolation layers 23B and 23C are higher than the element isolation layers 23A by equal to or more than 5 nm.

After that, the block insulating film 33 (an oxide film or an aluminum oxide film, in general) is formed, and a control gate electrode 34 is formed of a metal electrode or polysilicon. After that, the control gate electrode 34 is patterned so as to form a word line WL. After an impurity introduction process, a MOSFET diffusion region is formed in the active region. After that, after a formation step of an interlayer insulating layer and a wiring step as in a general LSI manufacturing process are performed, and then a nonvolatile semiconductor memory device including a MONOS-type memory cell transistor is completed.

The tunnel insulating film may be formed of an oxide-nitride-oxide (ONO) film in which a silicon oxide film, a silicon nitride film and a silicon oxide film are stacked in this order and which has an equal thickness based on effective oxide thickness (EOT) conversion, a two-layered film (hereinafter referred to as (SiN film/$SiO_2$ film)) in which a silicon oxide film and a silicon nitride film are stacked in this order from the lower layer side, a three-layered film of ($SiO_2$ film/high-dielectric insulating film/$SiO_2$ film), or two-layered film of (high-dielectric insulating film/$SiO_2$ film). The high-dielectric insulating film refers to an insulating film having a higher dielectric constant than the silicon oxide film. Alternatively, a single-layered film or a stacked film with a configuration other than the above-described configurations may also be used.

The silicon nitride film used as the charge storage layer may be replaced with an HfAlO film or a stacked film including a high-dielectric insulating film. Films that may be used as the high-dielectric insulating film include $Al_2O_3$ film, MgO film, SrO film, BaO film, TiO film, $Ta_2O_5$ film, $BaTiO_3$ film, BaZrO film, $ZrO_2$ film, $HfO_2$ film, $Y_2O_3$ film, ZrSiO film, HSiO film, LaAlO film, and the like. In this case, a stacked film including a high-dielectric insulating film may be configured as (SiN film/high-dielectric insulating film/SiN film), (HfAlO film/high-dielectric insulating film/SiN film), (SiN film/high-dielectric insulating film/HfAlO film), or (HfAlO film/high-dielectric insulating film/HfAlO film).

The aluminum oxide film used as the block insulating film may be replaced with a high-dielectric insulating film, or a stacked film including a high-dielectric insulating film. Films that may be used as the high-dielectric insulating film include an MgO film, an SrO film, an SiN film, a BaO film, a TiO film, a $Ta_2O_5$ film, a $BaTiO_3$ film, an LaAlO film, and the like. Further, stacked films that may be used as the stacked films including such high-dielectric insulating films include ($Al_2O_3$ film/high-dielectric insulating film), (high-dielectric insulating film/$Al_2O_3$ film), ($SiO_2$ film/high-dielectric insulating film/$SiO_2$ film), ($SiO_2$ film, high-dielectric insulating film), (high-dielectric insulating film/$SiO_2$ film), (high-dielectric insulating film/$SiO_2$ film/high-dielectric insulating film), and the like.

(Effects)

As described above, according to the second embodiment, the nonvolatile semiconductor memory device 10 comprises a region R1 in which the memory cell array unit 11 is arranged, and which includes an active region having a width of the minimum feature size F, and a region R2 in which the WL extracting portion configured to extract a word line WL provided in the memory cell array unit 11, and which includes an active region having a width greater than the minimum feature size F. In the region R1, the element isolation layer is lowered to a large depth such that the electric field to be applied to the tunnel insulation field is increased. In the region R2, the element isolation layer is lowered to a small depth such that the distance between the active region and the control gate electrode increases.

Accordingly, according to the second embodiment, the tunnel electric field of the memory cell transistor MC can be set to be optimized, thereby increasing the operation speed of the memory cell transistor MC and decreasing various operation voltages applied to the word line WL. In the region R2, the distance between the control gate electrode and the active region can be increased, and thereby breakdown voltage of the tunnel insulating film and the block insulating film can be improved.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
    a semiconductor substrate including a first region in which a memory cell transistor is arranged, a second region in which an electrode that extracts a word line electrically connected to the memory cell transistor is arranged, and a third region in which a peripheral transistor is arranged, the semiconductor substrate including an element isolation layer which separates adjacent active regions;
    first active regions provided in the first region and each having a first width;
    a first stacked film including a tunnel insulating film and a floating gate electrode stacked on each of the first active regions;
    second active regions provided in the second region and each having a second width greater than the first width;
    a second stacked film including the tunnel insulating film and the floating gate electrode stacked on each of the second active regions;
    third active regions provided in the third region and each having a third width greater than the first width;
    a third stacked film including the tunnel insulating film and the floating gate electrode stacked on each of the third active regions;
    an intergate insulating film provided on the floating gate electrode and the element isolation layer;

a control gate electrode provided on an intergate insulating film in the first and second regions and corresponding to the word line; and a gate electrode provided on an intergate insulating film in the third region, wherein an upper surface of an element isolation layer in the second region is higher than an upper surface of an element isolation layer in the first region, and a curvature radius of a corner of an upper portion of the floating gate electrode of the second stacked film is greater than that of the floating gate electrode of the third stacked film.

2. The device according to claim 1, wherein an upper surface of an element isolation layer in the third region is higher than an upper surface of the element isolation layer in the second region.

3. The device according to claim 1, further comprising:

a selection transistor provided in the first region and configured to select the memory cell, wherein the second region further includes an electrode that extracts a selection gate line electrically connected to the selection transistor, the selection transistor includes a fourth stacked film in which a tunnel insulating film, a floating gate electrode, an intergate insulating film, and a gate electrode are stacked, the intergate insulating film includes a slit that electrically connects the floating gate electrode and the gate electrode, and an end of the slit is positioned between a boundary between the first region and the second region and a second active region included in the second active regions and closest to the first region.

4. The device according to claim 1, wherein the upper surface of the element isolation layer in the first region is lower than an upper surface of the floating gate electrode of the first stacked film, and the upper surface of the element isolation layer in the second region is lower than an upper surface of the floating gate electrode of the second stacked film.

5. The device according to claim 1, wherein an upper surface of an element isolation layer in the third region has a height same as a height of an upper surface of the floating gate electrode of the third stacked film.

6. A nonvolatile semiconductor memory device comprising:

a semiconductor substrate including a first region in which a memory cell transistor is arranged, a second region in which an electrode that extracts a word line electrically connected to the memory cell transistor is arranged, and a third region in which a peripheral transistor is arranged, the semiconductor substrate including an element isolation layer which separates adjacent active regions;

first active regions provided in the first region and each having a first width;

a first stacked film including a tunnel insulating film and a floating gate electrode stacked on each of the first active regions;

second active regions provided in the second region and each having a second width greater than the first width;

a second stacked film including a gate insulating film and the floating gate electrode stacked on each of the second active regions, the gate insulating film having a thickness greater than a thickness of the tunnel insulation film;

third active regions provided in the third region and each having a third with greater than the first width;

a third stacked film including the gate insulating film and the floating gate electrode stacked on each of the third active regions;

an intergate insulating film provided on the floating gate electrode and the element isolation layer;

a control gate electrode provided on an intergate insulating film in the first and second regions and corresponding to the word line; and a gate electrode provided on an intergate insulating film in the third region, wherein an upper surface of an element isolation layer in the second region is higher than an upper surface of an element isolation layer in the first region, and a curvature radius of a corner of an upper portion of the floating gate electrode of the second stacked film is greater than that of the floating gate electrode of the third stacked film.

7. The device according to claim 6, wherein an upper surface of an element isolation layer in the third region is higher than an upper surface of the element isolation layer in the second region.

8. The device according to claim 6, further comprising:

a selection transistor provided in the first region and configured to select the memory cell, wherein the second region further includes an electrode that extracts a selection gate line electrically connected to the selection transistor, the selection transistor includes a fourth stacked film in which a tunnel insulating film, a floating gate electrode, an intergate insulating film, and a gate electrode are stacked, the intergate insulating film includes a slit that electrically connects the floating gate electrode and the gate electrode, and an end of the slit is positioned between a boundary between the first region and the second region and a second active region included in the second active regions and closest to the first region.

9. The device according to claim 6, wherein the upper surface of the element isolation layer in the first region is lower than an upper surface of the floating gate electrode of the first stacked film, and the upper surface of the element isolation layer in the second region is lower than an upper surface of the floating gate electrode of the second stacked film.

10. The device according to claim 6, wherein an upper surface of an element isolation layer in the third region has a height same as a height of an upper surface of the floating gate electrode of the third stacked film.

11. The device according to claim 6, wherein a position of an upper surfaces of the second and third active regions are less or equal to a position of an upper surfaces of the first active regions.

* * * * *